US008969168B2

(12) United States Patent
Ninomiya et al.

(10) Patent No.: US 8,969,168 B2
(45) Date of Patent: Mar. 3, 2015

(54) METHOD FOR MANUFACTURING VARIABLE RESISTANCE ELEMENT

(75) Inventors: Takeki Ninomiya, Osaka (JP); Yukio Hayakawa, Kyoto (JP); Takumi Mikawa, Shiga (JP); Takeshi Takagi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 102 days.

(21) Appl. No.: 13/809,473

(22) PCT Filed: Jan. 30, 2012

(86) PCT No.: PCT/JP2012/000559
§ 371 (c)(1),
(2), (4) Date: Jan. 10, 2013

(87) PCT Pub. No.: WO2012/105214
PCT Pub. Date: Aug. 9, 2012

(65) Prior Publication Data
US 2013/0178042 A1 Jul. 11, 2013

(30) Foreign Application Priority Data

Jan. 31, 2011 (JP) .................................. 2011-019104

(51) Int. Cl.
*H01L 45/00* (2006.01)
*G11C 13/00* (2006.01)

(52) U.S. Cl.
CPC ............ *H01L 45/1641* (2013.01); *H01L 45/08* (2013.01); *H01L 45/146* (2013.01); *H01L 45/1608* (2013.01); *H01L 45/1675* (2013.01); *G11C 13/0007* (2013.01)

USPC .......................................................... 438/382

(58) Field of Classification Search
None
See application file for complete search history.

(56) References Cited

U.S. PATENT DOCUMENTS

| 6,207,488 | B1 | 3/2001 | Hwang et al. |
| 8,022,502 | B2 | 9/2011 | Kanzawa et al. |
| 2009/0283736 | A1* | 11/2009 | Kanzawa et al. ................. 257/2 |

(Continued)

FOREIGN PATENT DOCUMENTS

| JP | 2009-124167 | 6/2009 |
| JP | 2010-70953 | 4/2010 |

(Continued)

OTHER PUBLICATIONS

International Search Report issued Mar. 6, 2012 in corresponding International Application No. PCT/JP2012/000559.

(Continued)

*Primary Examiner* — Charles Garber
*Assistant Examiner* — Stanetta Isaac
(74) *Attorney, Agent, or Firm* — Wenderoth, Lind & Ponack, L.L.P.

(57) ABSTRACT

Provided is a method for manufacturing a variable resistance element, the method including: forming a first electrode material layer above a substrate; forming a first tantalum oxide material layer; forming a second tantalum oxide material layer; forming a second electrode material layer; and annealing at least the first tantalum oxide material layer after forming the first tantalum oxide material layer and before forming the second electrode material layer, wherein an oxygen content percentage of one of the first tantalum oxide material layer and the second tantalum oxide material layer is higher than an oxygen content percentage of the other.

11 Claims, 15 Drawing Sheets

(56) References Cited

U.S. PATENT DOCUMENTS

| | | |
|---|---|---|
| 2010/0308298 A1 | 12/2010 | Ninomiya et al. |
| 2011/0031465 A1* | 2/2011 | Mitani et al. ............ 257/4 |
| 2011/0294259 A1 | 12/2011 | Kanzawa et al. |

FOREIGN PATENT DOCUMENTS

| | | |
|---|---|---|
| JP | 2010-226058 | 10/2010 |
| JP | 2010-251352 | 11/2010 |
| WO | 2008/149484 | 12/2008 |
| WO | 2010/038423 | 4/2010 |
| WO | 2010/087000 | 8/2010 |

OTHER PUBLICATIONS

Reply to Written Opinion issued Mar. 6, 2012 in International Application No. PCT/JP2012/000559 (with English translation).

Satoshi Kamiyama et al., "Ultrathin Tantalum Oxide Capacitor Dielectric Layers Fabricated Using Rapid Thermal Nitridation prior to Low Pressure Chemical Vapor Deposition", Journal of the Electrochemical Society, vol. 140, No. 6, Jun. 1993, pp. 1617-1625.

* cited by examiner

METHOD FOR MANUFACTURING VARIABLE RESISTANCE ELEMENT

TECHNICAL FIELD

The present invention relates to a method for manufacturing a variable resistance element a resistance value of which changes by application of a voltage pulse.

BACKGROUND OF INVENTION

In recent years, with advance in digital technology, electronic devices such as mobile information devices and information home appliances have been developed to provide higher functionality. As the electronic devices provide higher functionality, miniaturization and an increase in speed of semiconductor devices for use with the electronic devices are making rapid progress. Among them, the use of large capacity nonvolatile memory, represented by flash memory, is rapidly expanding. Furthermore, as a next-generation new nonvolatile memory replacing the flash memory, there is on-going research and development of nonvolatile memory devices using what is called a variable resistance element (for example, see PTL 1).

Here, the variable resistance element refers to an element which has a characteristic in which a resistance value reversibly changes depending on electric signals, and further can store therein information corresponding to the resistance value in a nonvolatile fashion. Specifically, the variable resistance element includes a variable resistance layer between a first electrode layer and a second electrode layer. In the case of a bipolar variable resistance element, when voltage pulses having different polarities are applied to the first electrode layer and the second electrode layer of the variable resistance element, resistance change phenomenon occurs in the variable resistance layer. Specifically, when a negative voltage pulse is applied between the electrodes, the resistance state of the variable resistance layer turns to a low resistance state. In contrast, when a positive voltage pulse is applied between the electrodes, the resistance state of the variable resistance layer changes from the low resistance state to a high resistance state. A nonvolatile memory device using the variable resistance element is a memory which writes and reads records, utilizing at least binary values (two states) which are the high resistance state and the low resistance state of the variable resistance layer.

PTL 1 relates to the variable resistance layer of the nonvolatile memory device, and discloses a variable resistance element using, as the variable resistance layer, a stack of tantalum oxide layers having different oxygen content percentages.

CITATION LIST

Patent Literature

[PTL 1] WO2008/149484

SUMMARY OF INVENTION

FIG. 17 shows a nonvolatile memory device incorporating a conventional variable resistance element, using, as a variable resistance layer, a stack of tantalum oxide layers having different oxygen content percentages. Here, the oxygen content percentage is a ratio of the number of oxygen atoms relative to the total number of atoms constituting a tantalum oxide.

As shown in FIG. 17, a nonvolatile memory device 20 includes a substrate 200 on which a first line 201 is formed, a first interlayer insulating layer 202 formed over the first line 201 and on the substrate 200, and a first contact plug 204 embedded within a first contact hole 203 extending thorough the first interlayer insulating layer 202. A variable resistance element 212 which includes a first electrode layer 205, a variable resistance layer 206, and a second electrode layer 207 is formed over the first contact plug 204 and above the first interlayer insulating layer 202. The first line 201 and the first electrode layer 205 are electrically connected via the first contact plug 204. Furthermore, the second interlayer insulating layer 208 is formed over the variable resistance element 212, and a second contact plug 210 is formed within a second contact hole 209 extending through the second interlayer insulating layer 208. The second electrode layer 207 and the second line 211 are electrically connected via the second contact plug 210. The second line 211 is formed over the second contact plug 210 and on the second interlayer insulating layer 208.

The variable resistance layer 206 has a stacked structure including a first tantalum oxide layer 206a and a second tantalum oxide layer 206b. The second tantalum oxide layer 206b has a higher oxygen content percentage than the first tantalum oxide layer 206a. Here, a second tantalum oxide material layer 206bF that is included in the second tantalum oxide layer 206b has a composition represented by, for example, $TaO_y$ satisfying $2.1 \leq y$. A first tantalum oxide material layer 206aF that is included in the first tantalum oxide layer 206a has a composition represented by, for example, $TaO_x$ satisfying $0.8 \leq x \leq 1.9$. Since the second tantalum oxide layer 206b has a higher oxygen content percentage than the first tantalum oxide layer 206a, the resistivity of the second tantalum oxide layer 206b is higher than the resistivity of the first tantalum oxide layer 206a.

In such a conventional nonvolatile memory device, improvement of the endurance characteristics is desired. The conventional manufacturing method, however, has a problem that a nonvolatile memory device having a desired high endurance characteristics cannot be obtained.

To solve the above problems, an object of the present invention is to provide a method for manufacturing a variable resistance element which allows for improvement of the endurance characteristics of the nonvolatile memory device.

A method of manufacturing a variable resistance element according to one embodiment of the present invention includes: forming a first electrode material layer above a substrate; forming a first tantalum oxide material layer on the first electrode material layer; forming a second tantalum oxide material layer on the first tantalum oxide material layer; forming a second electrode material layer on the second tantalum oxide material layer; and annealing at least the first tantalum oxide material layer to inhibit diffusion of oxygen atoms in the first tantalum oxide material layer and the second tantalum oxide material layer, after forming the first tantalum oxide material layer and before forming the second electrode material layer, wherein an oxygen content percentage of one of the first tantalum oxide material layer and the second tantalum oxide material layer is higher than an oxygen content percentage of the other.

Moreover, a method for manufacturing a variable resistance element according to one embodiment of the present invention includes: forming a first electrode material layer above a substrate; forming a first metal oxide material layer on the first electrode material layer; forming a second metal oxide material layer on the first metal oxide material layer; forming a second electrode material layer on the second metal oxide material layer; and annealing at least the first metal oxide material layer to inhibit diffusion of oxygen atoms in the first metal oxide material layer and the second metal oxide material layer, after forming the first metal oxide material layer and before forming the second electrode material layer, wherein an oxygen content percentage of one of the first metal oxide material layer and the second metal oxide material layer is higher than an oxygen content percentage of the other.

According to the present invention, the method for manufacturing the variable resistance element which allows for improvement of the endurance characteristics of the nonvolatile memory device can be provided.

DETAILED DESCRIPTION OF INVENTION

Figure 1:
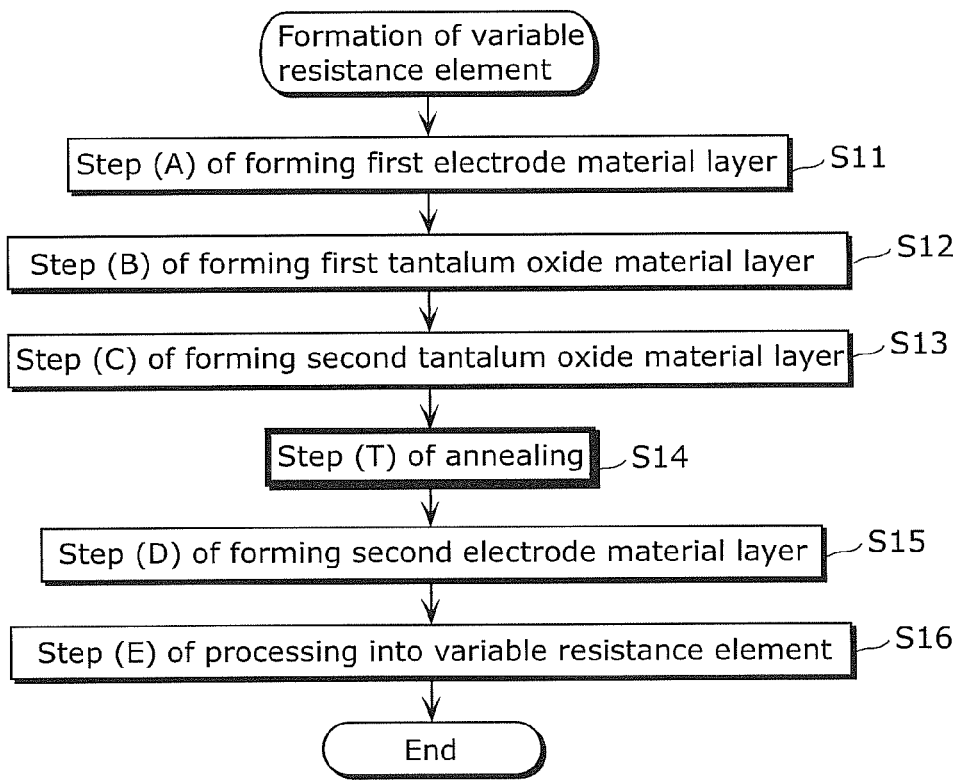
FIG. 1 is a process flow diagram illustrating steps of forming a variable resistance element according to an embodiment 1.

A method for manufacturing a variable resistance element according to one embodiment of the present invention includes: forming a first electrode material layer above a substrate; forming a first tantalum oxide material layer on the first electrode material layer; forming a second tantalum oxide material layer on the first tantalum oxide material layer; forming a second electrode material layer on the second tantalum oxide material layer; and annealing at least the first tantalum oxide material layer to inhibit diffusion of oxygen atoms in the first tantalum oxide material layer and the second tantalum oxide material layer, after forming the first tantalum oxide material layer and before forming the second electrode material layer, wherein an oxygen content percentage of one of the first tantalum oxide material layer and the second tantalum oxide material layer is higher than an oxygen content percentage of the other.

According to the above configuration, the annealing is performed after the first tantalum oxide material layer is formed and before the second electrode material layer is formed, thereby inhibiting the diffusion of oxygen from one of the first tantalum oxide material layer and the second tantalum oxide material layer that has a higher oxygen content percentage to the other that has a lower higher oxygen content percentage. This can inhibit the deterioration of the oxygen concentration profile due to a thermal budget given after the variable resistance element is formed, and improve the endurance characteristics of the nonvolatile memory device.

Moreover, preferably, a temperature of the annealing is 300° C. or higher and 450° C. or lower.

According to the above configuration, performing the annealing at a temperature greater than or equal to 300° C. or less than or equal to 450° C. effectively inhibits the diffusion of oxygen from one of the first tantalum oxide material layer and the second tantalum oxide material layer that has a higher oxygen content percentage to the other that has a lower oxygen content percentage. This can inhibit the deterioration of the oxygen concentration profile due to a thermal budget given after the variable resistance element is formed, and improve the endurance characteristics of the nonvolatile memory device.

Moreover, preferably, duration of the annealing is five seconds or longer and 600 seconds or shorter.

According to the above configuration, performing the annealing for a time duration in the range between five seconds or longer and 600 seconds or shorter can effectively inhibit the diffusion of oxygen from one of the first tantalum oxide material layer and the second tantalum oxide material layer that has a higher oxygen content percentage to the other that has a lower oxygen content percentage. This can inhibit the deterioration of the oxygen concentration profile due to the thermal budget given after the variable resistance element is formed, and improve the endurance characteristics of the nonvolatile memory device.

Moreover, preferably, the annealing is included after forming the second tantalum oxide material layer and before forming the second electrode material layer.

According to the above configuration, since the annealing is performed after the second tantalum oxide material layer is formed and before the second electrode material layer is formed, it is conceived that if the oxygen content percentage of the second tantalum oxide material layer is low, the second tantalum oxide material layer is densified, and if the oxygen content percentage of the second tantalum oxide material layer is high, the bonding between tantalum included in the second tantalum oxide material layer and oxygen increases, thereby chemically stabilizing the second tantalum oxide material layer. This can inhibit the diffusion of oxygen from one of the first tantalum oxide material layer and the second tantalum oxide material layer that has a higher oxygen content percentage to the other having a lower oxygen content percentage. Thus, the deterioration of the oxygen concentration profile due to the thermal budget given after the variable resistance element is formed can be inhibited, thereby improving the endurance characteristics of the nonvolatile memory device.

Moreover, preferably, the annealing is included after forming the first tantalum oxide material layer and before forming the second tantalum oxide material layer.

According to the above configuration, since the annealing is performed after the first tantalum oxide material layer is formed and before the second tantalum oxide material layer is formed, it is conceived that if the oxygen content percentage of the first tantalum oxide material layer is low, the first tantalum oxide material layer is densified, and if the oxygen content percentage of the first tantalum oxide material layer is high, the bonding between tantalum included in the first tantalum oxide material layer and oxygen increases, thereby chemically stabilizing the first tantalum oxide material layer. This can inhibit the diffusion of oxygen from one of the first tantalum oxide material layer and the second tantalum oxide material layer that has a higher oxygen content percentage to the other that has a lower oxygen content percentage. Thus, the deterioration of the oxygen concentration profile due to the thermal budget given after the variable resistance element is formed can be inhibited, thereby improving the endurance characteristics of the nonvolatile memory device.

Moreover, preferably, the oxygen content percentage of the second tantalum oxide material layer is higher than the oxygen content percentage of the first tantalum oxide material layer.

Moreover, preferably, in the annealing, the annealing is performed by a rapid thermal annealing.

According to the above configuration, the annealing when heating can be rapidly performed. For example, when the annealing performed in the step of annealing is the heater heating annealing in which the substrate is placed on a heater and annealed, the rate of temperature increase is slow and thus the heat-up time taken for a desired temperature to be reached is long, as compared to the rapid thermal annealing, ending up the diffusion of an increased amount of oxygen, during heating up, from one of the first tantalum oxide material layer and the second tantalum oxide material layer that has a higher oxygen content percentage to the other that has a lower oxygen content percentage. In contrast, when the annealing performed in the step of annealing is the rapid thermal annealing, the annealing is rapidly performed, allowing the deterioration of the oxygen concentration profile during the annealing to be inhibited.

Moreover, preferably, in the annealing, the annealing is performed in a reducing atmosphere.

When the annealing is performed in an oxygen atmosphere containing oxygen gas or ozone gas, the first tantalum oxide material layer or the second tantalum oxide material layer ends up oxidized. According to the above configuration, in the step of annealing, the annealing is performed in an inert gas atmosphere comprising, for example, nitrogen gas or argon gas, or in a reducing atmosphere such as the reduced pressure atmosphere, thereby inhibiting the first tantalum oxide material layer or the second tantalum oxide material layer to be oxidized by gas included in the annealing atmosphere.

A method for manufacturing a variable resistance element according to one embodiment of the present invention includes: forming a first electrode material layer above a substrate; forming a first metal oxide material layer on the first electrode material layer; forming a second metal oxide material layer on the first metal oxide material layer; forming a second electrode material layer on the second metal oxide material layer; and annealing at least the first metal oxide material layer to inhibit diffusion of oxygen atoms in the first metal oxide material layer and the second metal oxide material layer, after forming the first metal oxide material layer and before forming the second electrode material layer, wherein an oxygen content percentage of one of the first metal oxide material layer and the second metal oxide material layer is higher than an oxygen content percentage of the other.

According to the above configuration, performing the annealing after the first metal oxide material layer is formed and before the second electrode material layer is formed inhibits the diffusion of oxygen from one of the first metal oxide material layer and the second metal oxide material layer that has a higher oxygen content percentage to the other that has a lower oxygen content percentage. This can inhibit the deterioration of the oxygen concentration profile due to the thermal budget given after the variable resistance element is formed, and improve the endurance characteristics of the nonvolatile memory device.

Moreover, preferably, the annealing is included after forming the second metal oxide material layer and before forming the second electrode material layer.

According to the above configuration, since the annealing is performed after the second metal oxide material layer is formed and before the second electrode material layer is formed, it is conceived that if the oxygen content percentage of the second metal oxide material layer is low, the second metal oxide material layer is densified, and if the oxygen content percentage of the second metal oxide material layer is high, the bonding between a metal included in the second metal oxide material layer and oxygen increases, thereby chemically stabilizing the second metal oxide material layer. This can inhibit the diffusion of oxygen from one of the first metal oxide material layer and the second metal oxide material layer that has a higher oxygen content percentage to the other having a lower oxygen content percentage. Thus, the deterioration of the oxygen concentration profile due to the thermal budget given after the variable resistance element is formed can be inhibited, thereby improving the endurance characteristics of the nonvolatile memory device.

Moreover, preferably, the annealing is included after forming the first metal oxide material layer and before forming the second metal oxide material layer.

According to the above configuration, since the annealing is performed after the first metal oxide material layer is formed and before the second metal oxide material layer is formed, it is conceived that if the oxygen content percentage of the first metal oxide material layer is low, the first metal oxide material layer is densified, and if the oxygen content percentage of the first metal oxide material layer is high, the bonding between a metal included in the first metal oxide material layer and oxygen increases, thereby chemically stabilizing the first metal oxide material layer. This can inhibit the diffusion of oxygen from one of the first metal oxide material layer and the second metal oxide material layer that has a higher oxygen content percentage to the other that has a lower oxygen content percentage. Thus, the deterioration of the oxygen concentration profile due to the thermal budget given after the variable resistance element is formed can be inhibited, thereby improving the endurance characteristics of the nonvolatile memory device.

Figure 18:
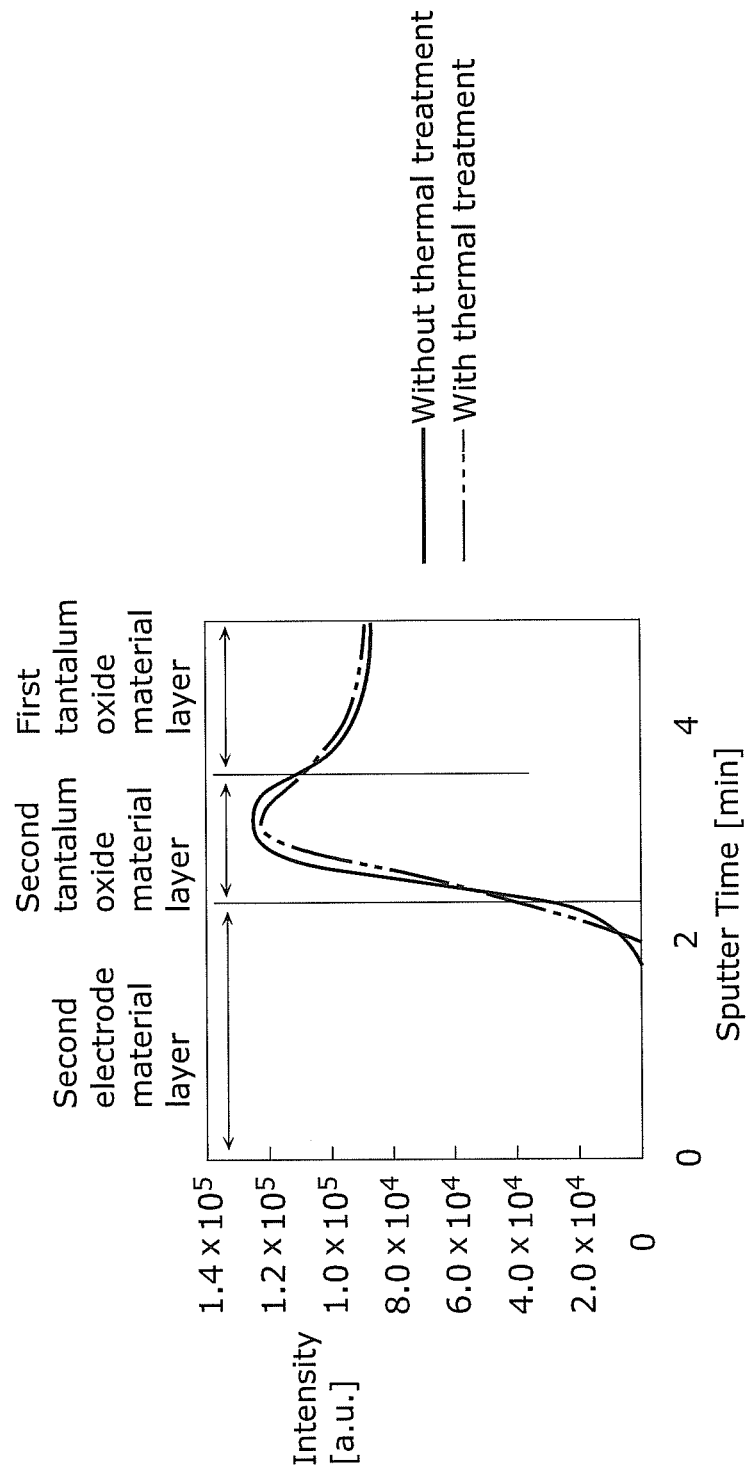
FIG. 18 is a diagram showing a result of analyzing, by Auger electron spectroscopy, oxygen concentration profiles of a stacked film, which includes a first tantalum oxide material layer and a second tantalum oxide material layer, formed according to a conventional manufacturing method.

Before describing details of embodiments of the present invention, the inventors' findings will be described. Specifically, through intensive studies to improve reliability of the nonvolatile memory device and as a result, the inventors have found that oxygen in the second tantalum oxide layer diffuses due to a thermal budget given to the variable resistance element, leading to deterioration of the endurance characteristics, and have completed the present invention. Hereinafter, the findings will be described, with reference to FIG. 18, provided that FIG. 18 and the description are intended as an aid in understanding embodiments of the present invention, and the present invention is not limited thereto.

It is estimated that the resistance change phenomenon of the nonvolatile memory device 20 results from the following processes. When voltage pulses having different polarities are applied to the first electrode layer 205 and the second electrode layer 207 of the nonvolatile memory device 20, oxygen is transferred between a second tantalum oxide layer 206b and a first tantalum oxide layer 206a. Specifically, when a negative voltage pulse based on the first electrode layer 205 is applied to the second electrode layer 207, oxygen ions migrate from the second tantalum oxide layer 206b that has high resistivity to the first tantalum oxide layer 206a that has low resistivity, and thereby the resistance state of the nonvolatile memory device 20 turns to the low resistance state. In contrast, when a positive voltage pulse based on the first electrode layer 205 is applied to the second electrode layer 207, oxygen ions migrate from the first tantalum oxide layer 206a to the second tantalum oxide layer 206b, and thereby the resistance state of the nonvolatile memory device 20 changes from the low resistance state to the high resistance state.

As described above, since the resistance change phenomenon of the nonvolatile memory device occurs due to the migration of oxygen ions, there arises a problem that the oxygen concentration profiles (oxygen concentration distributions) of the second tantalum oxide layer 206b and the first tantalum oxide layer 206a are deteriorated by a cycling operation in which the resistance state of the nonvolatile memory device 20 is repeatedly changed. Furthermore, a problem arises that the deterioration of the oxygen concentration profiles due to the cycling operation cause the nonvolatile memory device 20 to gradually become resistant to the resistance change operation. Thus, to increase the number of times (hereinafter, referred to as endurance characteristics) the nonvolatile memory device 20 is allowed to repeatedly perform the resistance change operation, it is desirable that the oxygen concentration profile of the variable resistance layer 206 immediately after the completion of the nonvolatile memory device 20 remains intact.

The inventors have found that the oxygen concentration profile immediately after the deposition of the variable resistance layer 206 ends up deteriorated through the steps of manufacturing the nonvolatile memory device 20. In the step of manufacturing the nonvolatile memory device 20, thermal budgets are given to the variable resistance element 212 due to thermal treatments in steps such as the deposition of interlayer insulating layers, plug formation, line formation, and transistor recovery. The thermal budget causes diffusion of oxygen from the second tantalum oxide layer 206b to the first tantalum oxide layer 206a in the variable resistance layer 206, ending up deterioration of the oxygen concentration profile of the variable resistance layer 206 from an initially formed state.

FIG. 18 is a diagram showing a result of analyzing, by Auger electron spectroscopy, oxygen concentration profile of a stacked film, which includes a first tantalum oxide material layer, a second tantalum oxide material layer, and a second electrode material layer, formed according to a conventional manufacturing method. Particularly, a result is shown which is obtained by analyzing, by Auger electron spectroscopy (AES), the oxygen concentration profile of a stacked film which includes the first tantalum oxide material layer represented by $TaO_x$, the second tantalum oxide material layer having a composition represented by $TaO_y$, and iridium as the second electrode material layer above the second tantalum oxide material layer. FIG. 18 shows a comparison of a sample (dashed line) to which the thermal budget is given and a sample (solid line) to which the thermal budget is not given, after the deposition of iridium as the second electrode material layer. After the second electrode material layer is formed, the sample to which the thermal budget has been given is thermally treated for 600 seconds in a nitrogen atmosphere at 400° C., using the rapid thermal annealing. As can be seen from FIG. 18, giving a thermal budget attenuates the AES peak intensity in the second tantalum oxide material layer and increases the AES peak intensity in the first tantalum oxide material layer. In other words, it can be determined that giving a thermal budget diffuses oxygen in the second tantalum oxide material layer to the first tantalum oxide material layer, and the oxygen concentration profile is deteriorated.

As described above, due to a thermal budget in the step of manufacturing the nonvolatile memory device, the oxygen concentration profile of the variable resistance layer deteriorates.

The present invention has been completed based on the above findings.

Hereinafter, embodiments according to the present invention will be described, with reference to accompanying drawings. It should be noted that the present invention will be described, with reference to the following embodiments and the accompanying drawing for illustration purposes only, and the present invention is not limited to the embodiments. Moreover, for description of the method for manufacturing a variable resistance element, a processing flow is shown and steps are shown using reference signs for simplification and clarity of the description, and does not precisely show the order of each step. According to embodiments, part of these steps may also be omitted, added, switched or performed in parallel.

In embodiments of the present invention, a heat treatment, which is a feature of the present invention, for purposes of inhibiting deterioration of the oxygen concentration profile will be described as anneal, and a process for giving a thermal budget in a manufacturing step after the variable resistance element is formed will simply be described as thermal treatment.

Embodiment 1

Method for Manufacturing Variable Resistance Layer

Figure 2:
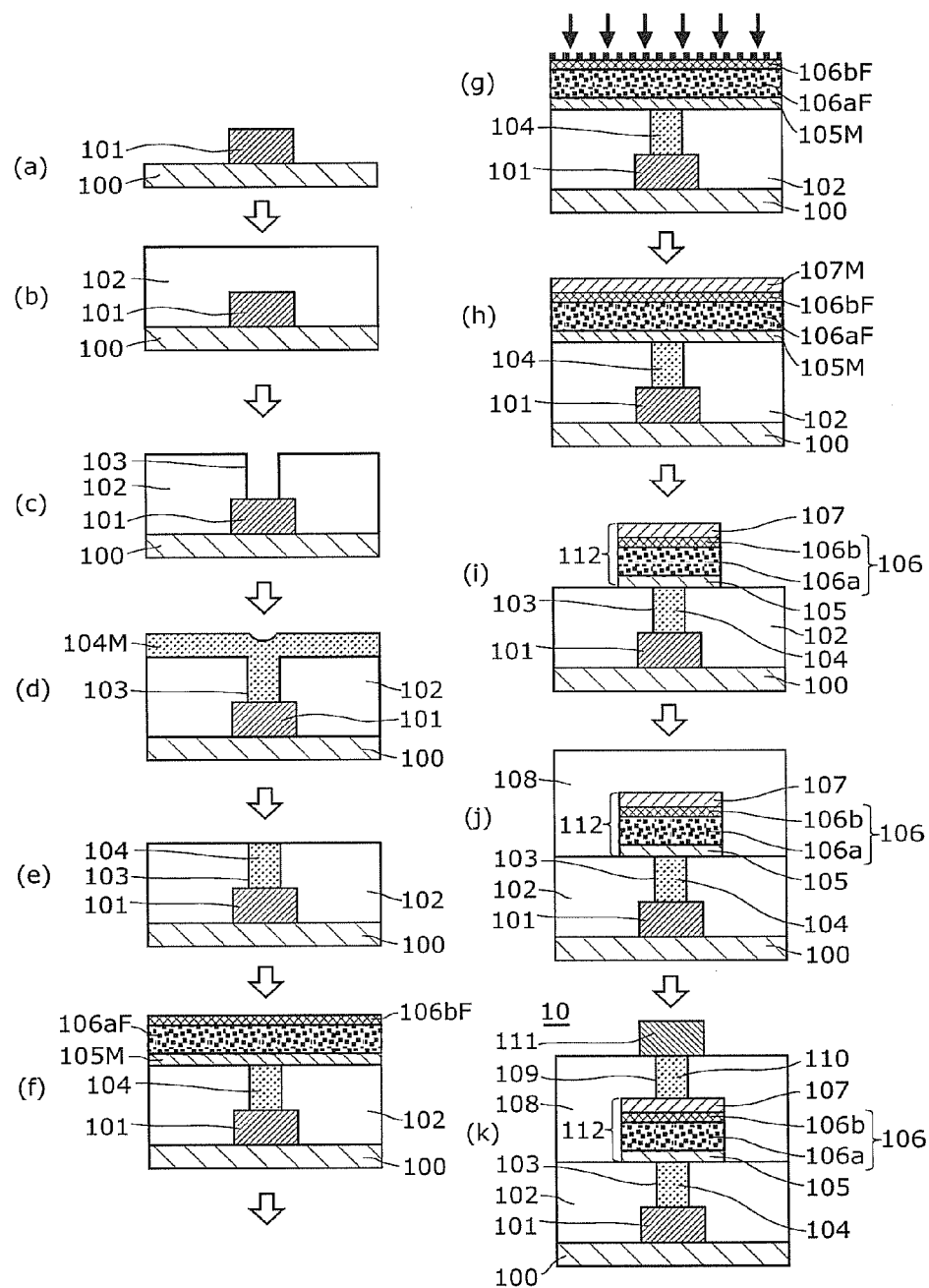
FIG. 2 shows cross-sectional views illustrating steps of a method for manufacturing important part of a nonvolatile memory device according to the embodiment 1, (a) is a cross-sectional view after a step of forming a first line on a substrate, (b) is a cross-sectional view after a step of forming a first interlayer insulating layer, (c) is a cross-sectional view after a step of forming a first contact hole, (d) and (e) are cross-sectional views illustrating steps of forming a first contact plug, (f) is a cross-sectional view after steps of forming a first electrode material layer, a first tantalum oxide material layer, and a second tantalum oxide material layer, (g) is a cross-sectional view illustrating a step of annealing, (h) is a cross-sectional view after a step of forming a second electrode material layer, (i) is a cross-sectional view after steps of forming a first electrode layer, a first tantalum oxide layer, a second tantalum oxide layer, and a second electrode layer, (j) is a cross-sectional view after a step of forming a second interlayer insulating layer, (k) is a cross-sectional view after steps of forming a second contact hole, a second contact plug, and a second line.

The nonvolatile memory device 10 according to the present embodiment (see (k) of FIG. 2) includes, above a substrate 100, a first line 101, a first interlayer insulating layer 102, a contact plug 104 formed within a contact hole 103, a first electrode layer 105, a variable resistance layer 106, a second electrode layer 107, a second interlayer insulating layer 108, a contact plug 110 formed within a contact hole 109, and a second line 111. The variable resistance layer 106 includes a first tantalum oxide layer 106a and a second tantalum oxide layer 106b. The first electrode layer 105, the variable resistance layer 106, and the second electrode layer 107 form a variable resistance element 112.

FIG. 1 is a process flow diagram showing steps of forming the variable resistance element 112 according to the embodiment 1. As shown in FIG. 1, the method for manufacturing the variable resistance element 112 according to the embodiment 1 includes the following: step (A) of forming a first electrode material layer 105M to be the first electrode layer 105; step (B) of forming a first tantalum oxide material layer 106aF to be the first tantalum oxide layer 106a; step (C) of forming a second tantalum oxide material layer 106bF to be the second tantalum oxide layer 106b; step (T) of annealing after the second tantalum oxide material layer 106bF is formed; step (D) of forming a second electrode material layer 107M to be the second electrode layer 107; and step (E) of processing the first electrode material layer 105M, the first tantalum oxide material layer 106aF, the second tantalum oxide material layer 106bF, and the second electrode material layer 107M to form the variable resistance element 112 which includes the first electrode layer 105, the first tantalum oxide layer 106a, the second tantalum oxide layer 106b, and the second electrode layer 107.

Here, at least one of the first tantalum oxide material layer 106aF and the second tantalum oxide material layer 106bF according to the present embodiment includes an oxygen-deficient tantalum oxide material layer, and the oxygen content percentage of one of the first tantalum oxide material layer 106aF and the second tantalum oxide material layer 106bF is higher than the oxygen content percentage of the other. The oxygen-deficient tantalum oxide material layer is an oxide having a non-stoichiometric composition in which an oxygen content percentage (atomic ratio: a ratio of the number of oxygen atoms relative to the total number of atoms) is low as compared to an oxide having a stoichiometric composition. When a transition metal included in the variable resistance layer is Ta (tantalum), a stoichiometric composition of the oxide is represented by $Ta_2O_5$, and the oxygen content percentage is 71.4%. Thus, the oxygen content percentage of the oxygen-deficient tantalum oxide material layer is greater than zero and less than 71.4%. The present embodiment will be described as an example with reference to a case where the oxygen content percentage of the second tantalum oxide material layer 106bF is higher than the oxygen content percentage of the first tantalum oxide material layer 106aF. It should be noted that the oxygen content percentages of the first tantalum oxide material layer 106aF and the second tantalum oxide material layer are not limited to the embodiment below. For example, a case where the oxygen content percentage of the first tantalum oxide material layer is higher than the oxygen content percentage of the second tantalum oxide material layer is also included in the present embodiment.

As shown in FIG. 1, the method for manufacturing the variable resistance element according to the embodiment 1 includes step (T) of annealing after step (C) of forming the second tantalum oxide material layer and before step (D) of forming the second electrode material layer.

[Method for Manufacturing Nonvolatile Memory Device]

Parts (a), (b), (c), (d), (e), (f), (g), (h), (i), (j), and (k) of FIG. 2 are cross-sectional views illustrating steps of a method for manufacturing important part of the nonvolatile memory device according to the embodiment 1. Part (a) of FIG. 2 is a cross-sectional view after a step of forming the first line 101 on the substrate 100, (b) of FIG. 2 is a cross-sectional view after a step of forming the first interlayer insulating layer 102, (c) of FIG. 2 is a cross-sectional view after a step of forming the first contact hole 103, (d) and (e) of FIG. 2 are cross-sectional views illustrating steps of forming the first contact plug 104, (f) of FIG. 2 is a cross-sectional view after steps of forming the first electrode material layer 105M, the first tantalum oxide material layer 106aF, and the second tantalum oxide material layer 106bF, (g) of FIG. 2 is a cross-sectional view illustrating a step of annealing, (h) of FIG. 2 is a cross-sectional view after a step of forming the second electrode material layer 107M, (i) of FIG. 2 is a cross-sectional view after steps of forming the first electrode layer 105, the first tantalum oxide layer 106a, the second tantalum oxide layer 106b, and the second electrode layer 107, (j) of FIG. 2 is a cross-sectional view after a step of forming the second interlayer insulating layer 108, and (k) of FIG. 2 is a cross-sectional view after steps of forming the second contact hole 109, the second contact plug 110, and the second line 111. Hereinafter, the method for manufacturing important part of the nonvolatile memory device 10 incorporating the variable resistance element 112 formed according to the process flow diagram shown in FIG. 1 will be described, with reference to (a) to (k) of FIG. 2.

Part (a) of FIG. 2 is the cross-sectional view after the step of forming the first line 101. In the present step, first, a conductive layer (thickness: 400 nm or greater and 600 nm or less) comprising aluminum is formed by a sputtering method on the substrate 100 on which transistors, underlying lines, and the like are formed. Next, the obtained conductive layer is processed by been patterned using a desired mask and dry etched, so as to have a desired pattern. Accordingly, the first line 101 is formed.

Part (b) of FIG. 2 is the cross-sectional view after the step of forming the first interlayer insulating layer 102. In the present step, first, a plasma TEOS (tetraethyl orthosilicate) as an insulating layer over the first line 101 is formed above the substrate 100 by the chemical vapor deposition (CVD) method. Next, a surface of the plasma TEOS is planarized to form the first interlayer insulating layer 102 (thickness: 500 nm or greater and 1000 nm or less). Accordingly, the first interlayer insulating layer 102 is formed. For reduction of parasitic capacitance between lines, a fluorine-containing oxide (for example, FSG) or a low-k material may be used for the first interlayer insulating layer 102, in addition to the plasma TEOS.

Part (c) of FIG. 2 is the cross-sectional view after the step of forming the first contact hole 103. In the present step, the first interlayer insulating layer 102 is processed by being patterned using a desired mask and dry etched, so as to have a desired pattern, to form the first contact hole 103 (diameter: 50 nm or greater and 300 nm or less) which is connected to the first line 101 and extending through the first interlayer insulating layer 102. Here, the first line 101 has an outline having a width greater than the first contact hole 103. This allows an area in contact between the first line 101 and the first contact plug 104 kept constant even if the mask is misaligned at patterning. As a result, for example, variation in a cell current due to the variation in the contact area can be prevented.

Part (d) of FIG. 2 is the cross-sectional view after the step of filling a conductive material of the first contact plug 104. In the present step, first, titanium (Ti) layer/titanium nitride (TiN) layer (thickness: 5 nm or greater and 30 nm or less, each) functioning as an adhesion layer and a diffusion barrier are deposited as a bottom layer by the sputtering method and the CVD method, respectively. Next, tungsten (W, thickness: 200 nm or greater and 400 nm or less), which is the principal component of the contact plug, is deposited as a top layer by the CVD. Accordingly, the first contact hole 103 is filled with the conductive layer 104M (W/Ti/TiN structure) having a stacked structure to be the first contact plug 104.

Part (e) of FIG. 2 is the cross-sectional view after a step of forming the first contact plug 104. In the present step, the planarization polishing is performed on an entire wafer surface of the conductive layer 104M using the chemical mechanical polishing (CMP) to remove unnecessary portion of the conductive layer 104M on the first interlayer insulating layer 102, and the first contact plug 104 is formed within the first contact hole 103.

Part (f) of FIG. 2 is the cross-sectional view after the step of forming the first electrode material layer 105M, the step of forming the first tantalum oxide material layer 106aF, and the step of forming the second tantalum oxide material layer 106bF. First, in the step of forming the first electrode material layer 105M, the first electrode material layer 105M (thickness: 20 nm or greater and 50 nm or less) comprising a tantalum nitride (TaN) is formed over the first contact plug 104 and on the first interlayer insulating layer 102 by a sputtering method (step S11 in FIG. 1).

Subsequently, in the step of forming the first tantalum oxide material layer 106aF, the first tantalum oxide material layer 106aF is formed on the first electrode material layer 105M by a sputtering method (step S12). For the formation of the first tantalum oxide material layer 106aF, for example, a reactive sputtering method is used in which a sputtering target comprising tantalum is sputtered in an atmosphere containing oxygen. The thickness of the first tantalum oxide material layer 106aF is measured using the spectroscopic ellipsometry, and the thickness is 20 nm or greater and 50 nm or less by way of example. Sputtering conditions are, by way of example, that power supply output is 1000 W, pressure of deposition is 0.05 Pa, argon flow is 20 sccm, and oxygen gas flow is 21 sccm. A composition (a value of x in $TaO_x$) of the first tantalum oxide material layer 106aF obtained by measuring, by the RBS method, the first tantalum oxide material layer 106aF having a thickness of 50 nm formed in the same conditions is x=1.22. Using the same test sample as used for the composition analysis, a resistance value is measured by the 4-terminal measurement method, a result of which indicates that the resistivity of the first tantalum oxide material layer 106aF is 3 mΩcm.

Subsequently, in the step of forming the second tantalum oxide material layer 106bF, the second tantalum oxide material layer 106bF is formed on the first tantalum oxide material layer 106aF (step S13). For the formation of the second tantalum oxide material layer 106bF, for example, a tantalum oxide having a composition represented by $Ta_2O_5$ is used as a sputtering target, and the RF magnetron sputtering method which uses argon (Ar) as the sputtering gas is employed. Sputtering conditions are, by way of example, that RF power supply output is 200 W, pressure of deposition is 0.3 Pa, argon gas flow is 300 sccm, and substrate temperature is a room temperature. A thickness, of the tantalum oxide material layer 106bF stacked on the first tantalum oxide material layer 106aF, that is effective to cause the resistance change can be measured using the spectroscopic ellipsometry, and the thickness is 3 nm or greater and 10 nm or less by way of example.

An attempt is made to measure the resistivity of the second tantalum oxide material layer 106bF having a film thickness of 50 nm by the 4-terminal measurement method. The resistivity, however, exceeds a measurable upper limit ($10^8$ Ω/sq.) and thus cannot be measured. Therefore, the resistivity of the second tantalum oxide material layer 106bF is at least $5\times10^5$ mΩcm or greater. Alternatively, the second tantalum oxide material layer 106bF can be formed by the atomic layer deposition (ALD) method or the CVD method.

It should be noted that the step illustrated in (f) of FIG. 2 corresponds to steps (A), (B), and (C) according to the present embodiment.

Part (g) of FIG. 2 is the cross-sectional view illustrating a step of annealing. In the present step, the substrate 100 above which the first tantalum oxide material layer 106aF and the second tantalum oxide material layer 106bF are formed is annealed (step S14). Examples of the annealing method include heater heating annealing in which the substrate 100 is placed on a heater and annealed, a rapid thermal annealing (RTA) in which the substrate 100 is rapidly annealed in heating, by being irradiated with a halogen lamp, and a method in which the substrate 100 is heated in a furnace.

Here, the rate of temperature increase in the case of the rapid thermal annealing is 1° C./second or faster and 60° C./second or slower, while the rate of temperature increase in the case of commonly conducted annealing using a furnace is about 10° C./minute (=0.17° C./second). The present embodiment will be described with reference to the rapid thermal annealing by way of example. For example, HeatPulse 8108 manufactured by AG Associates, USA is used as a device whereby the rapid thermal annealing is performed.

In the step of the rapid thermal annealing, annealing is performed in a nitrogen atmosphere at a temperature in a range between 400° C. and 450° C. both inclusive, taking processing time of ten seconds or longer and 600 seconds or shorter. It should be noted that the step illustrated in (g) of FIG. 2 corresponds to step (T) according to the present embodiment.

Part (h) of FIG. 2 is the cross-sectional view after the step of forming the second electrode material layer 107M. In the present step, iridium (Ir) as the second electrode material layer 107M is formed on the second tantalum oxide material layer 106bF by a sputtering method (step S15). It should be noted that the step illustrated in (h) of FIG. 2 corresponds to step (D) according to the present embodiment.

Part (i) of FIG. 2 is the cross-sectional view after the step of forming the variable resistance element 112. In the present step, the first electrode material layer 105M, the first tantalum oxide material layer 106aF, the second tantalum oxide material layer 106bF, and the second electrode material layer 107M are processed by being patterned using a desired mask and dry etched, so as to have a desired pattern such as a pattern having a square shape in plan. This forms the variable resistance element 112 which includes the first electrode layer 105, the first tantalum oxide layer 106a, the second tantalum oxide layer 106b, and the second electrode layer 107 (step S16). It should be noted that while the first electrode material layer 105M, the first tantalum oxide material layer 106aF, the second tantalum oxide material layer 106bF, and the second electrode material layer 107M are simultaneously patterned and dry etched to form the variable resistance element 112, the present invention is not limited thereto. For example, the first electrode material layer 105M, the first tantalum oxide material layer 106aF, the second tantalum oxide material layer 106bF, and the second electrode material layer 107M may be separately patterned and dry etched. The step illustrated in (i) of FIG. 2 corresponds to step (E) according to the present embodiment.

Part (j) of FIG. 2 is the cross-sectional view after the step of forming the second interlayer insulating layer 108. In the present step, the second interlayer insulating layer 108 (500 nm or greater and 1000 nm or less) is formed over the variable resistance element 112. After the formation of the second interlayer insulating layer 108, for purposes of relaxation of residual stress of the second interlayer insulating layer 108 and removal of residual water in the second interlayer insulating layer 108, for example, the nonvolatile memory device 10 is thermally treated for ten minutes in a furnace heated at 400° C.

Part (k) of FIG. 2 is the cross-sectional view after the steps of forming the second contact hole 109 and the second contact plug 110. In the present step, the second contact hole 109 and the second contact plug 110 are formed by the same manufacturing method as illustrated in (a) to (e) of FIG. 2. Then, the second line 111 is formed over the second contact plug 110. After the formation of the second line 111, for purposes of prevention of corrosion of aluminum included in the second line 111, for example, the nonvolatile memory device 10 is thermally treated for ten minutes in a furnace heated at 400° C. for completion.

As described above, in the method for manufacturing the nonvolatile memory device 10 according to the present embodiment, the step illustrated in (j) of FIG. 2 and the step illustrated in (k) of FIG. 2 each include a step of thermally treating the nonvolatile memory device 10 for ten minutes in a furnace heated at 400° C. The thermal treatment gives the variable resistance element 112 a thermal budget. It should be noted that the manufacturing method according to the present embodiment may not necessarily include the thermal treatment step (a thermal budget) described above. The present embodiment has advantageous effects on a thermal budget that occurs due to the introduction of a step other than the thermal treatment step described above, and also on a thermal budget that is added due to other various factors. Hereinafter, examples and a comparative example will be described, with reference to a thermal budget occurred by the thermal treatment step described above. The description, however, is for illustration purposes only and the present invention is not limited thereto.

[Presence and Absence of Deterioration of Oxygen Concentration Profile Due to Annealing Step]

As shown in FIG. 1, the annealing in step (T) is performed after step (B) of forming the first tantalum oxide material layer 106aF and before step (D) of forming the second electrode material layer 107M. In the present embodiment, the annealing is performed after the second tantalum oxide material layer 106bF is formed and before the second electrode material layer 107M is formed. Since the annealing is performed before the second electrode material layer 107M is formed, the diffusion of oxygen from the second tantalum oxide material layer 106bF to the first tantalum oxide material layer 106aF is inhibited even though the variable resistance element 112 is thermally treated which gives the variable resistance element 112 a thermal budget. Thus, an effect that the oxygen concentration profile of the variable resistance layer 106 hardly deteriorates is obtained.

It is conceived that the reason why the diffusion of oxygen is reduced by the annealing step is that the tantalum oxide material layer (at least one of the first tantalum oxide material layer 106aF and the second tantalum oxide material layer 106bF) which is formed by the sputtering method is sintered by the annealing, and improved to have a film quality whereby the diffusion of oxygen is relatively less likely to occur. It should be noted that sinter effects obtained by the annealing are also obtained when a metal oxide material layer comprising a material other than the tantalum oxide is annealed.

Moreover, it is conceived that the following is the reason why the diffusion of oxygen is inhibited in the present embodiment by the annealing after the first tantalum oxide material layer 106aF is formed and before the second electrode material layer 107M is formed.

Oxygen exists as ions in the second tantalum oxide. When the thermal treatment diffuses oxygen as atoms from the second tantalum oxide material layer 106bF to the first tantalum oxide material layer 106aF, electrons remain in the second tantalum oxide material layer 106bF for charge compensation. The electrons exist at a defect level in the second tantalum oxide material layer 106bF, and the defect level exists in a bandgap of the second tantalum oxide material layer 106bF. As the diffusion of oxygen proceeds, the electrons are accumulated at the defect level, accordingly. Once a certain number of electrons are accumulated in the second tantalum oxide material layer 106bF, however, the diffusion of oxide is inhibited by the second tantalum oxide material layer 106*b*F charged up by the electrons.

Here, if a thermal treatment, which gives the variable resistance element 112 a thermal budget, is performed after the second electrode material layer 107M is formed, rather than performing the anneal before the second electrode material layer 107M is formed, the electrons remained in the second tantalum oxide material layer 106*b*F end up flowing out from the defect level in the second tantalum oxide material layer 106*b*F to the conduction band of the second electrode material layer 107M along with the diffusion of oxygen. Thus, the electrons are not accumulated in the second tantalum oxide material layer 106*b*F, and the second tantalum oxide material layer 106*b*F is not charged up. As a result, the effects of inhibiting the diffusion of oxygen as described above are not obtained.

On the other hand, when the annealing is performed before the second electrode material layer 107M is formed, to sinter the second tantalum oxide material layer 106*b*F in a state in which a certain number of electrons is allowed to be accumulated in the second tantalum oxide material layer 106*b*F, the tantalum oxide material layer can be improved to have the film quality whereby the diffusion of oxygen is relatively less likely to occur. This can inhibit the electrons remained in the second tantalum oxide material layer 106*b*F from flowing out from the defect level in the second tantalum oxide material layer 106*b*F to the conduction band of the second electrode material layer 107M.

Due to the above reasons, in the present embodiment, the annealing step is carried out before the second electrode material layer 107M is formed, and thereby the diffusion of oxygen from the second tantalum oxide material layer 106*b*F to the first tantalum oxide material layer 106*a*F is inhibited even though the variable resistance element 112 is thermally treated which gives the variable resistance element 112 a thermal budget.

It should be noted that the effects of inhibiting the diffusion of oxygen are conceived to be achieved even when the metal oxide material layer comprises a material other than tantalum oxide. Specifically, the effects are also conceived to be achieved if a defect level based on oxygen vacancies is the metal oxide material layer existing in a bandgap of a metal oxide material layer.

Figure 3:
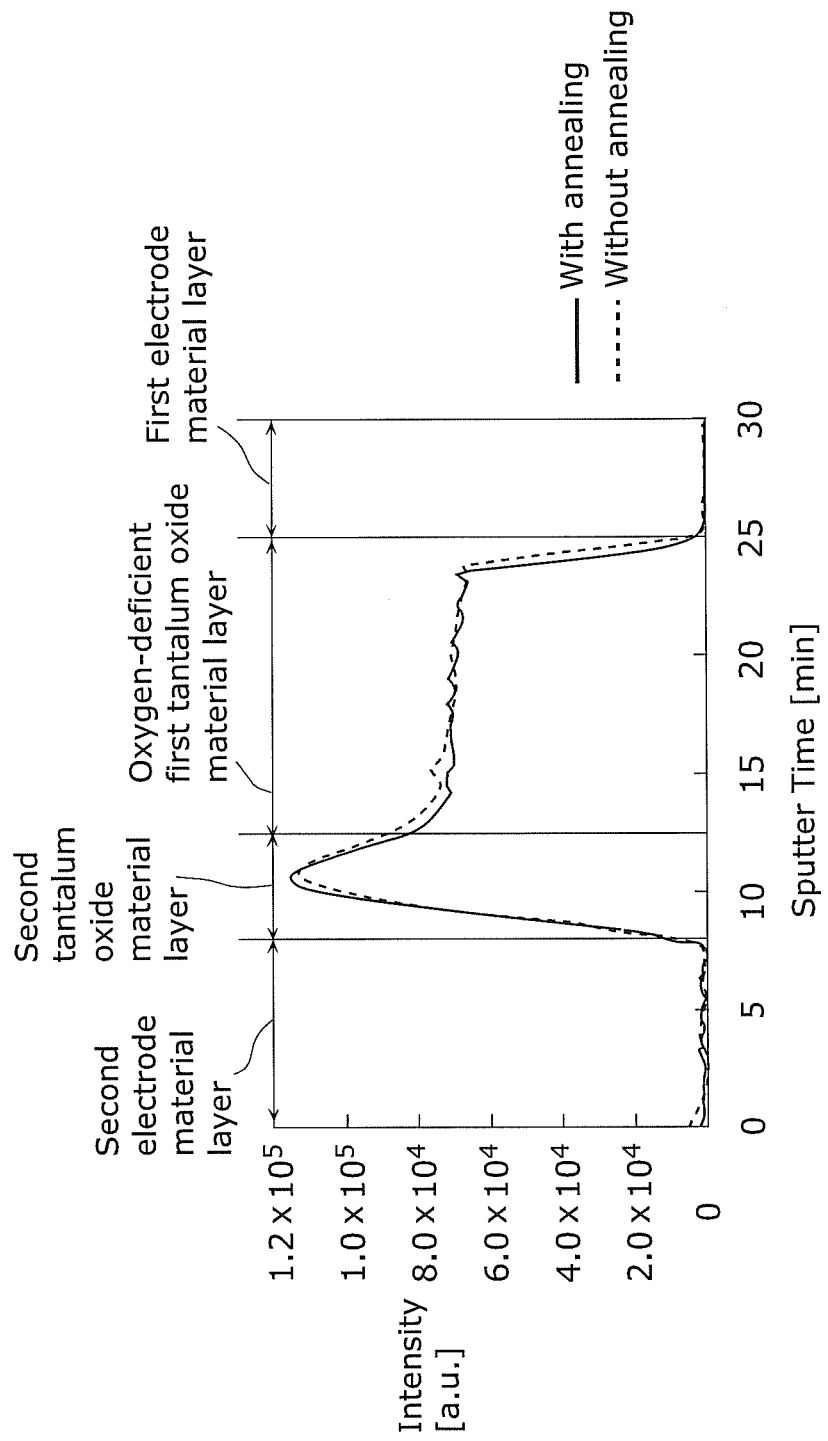
FIG. 3 is a diagram showing a result of analyzing, by Auger electron spectroscopy, oxygen concentration profiles of a variable resistance layer before and after annealing.

FIG. 3 is a diagram showing a result of analyzing, by Auger electron spectroscopy, the oxygen concentration profiles of the variable resistance layer before and after the anneal. Particularly, FIG. 3 is a diagram showing a result of analyzing, by Auger electron spectroscopy, the oxygen concentration profile of a stacked film which includes the first electrode material layer 105M, the first tantalum oxide material layer 106*a*F, the second tantalum oxide material layer 106*b*F, and the second electrode material layer 107M. In FIG. 3, comparison is made between the oxygen concentration profile (solid line in FIG. 3) of the variable resistance element 112 (example) on which the annealing in the process flow diagram shown in FIG. 1 is performed and the oxygen concentration profile (dashed line in FIG. 3) of the variable resistance element 212 (comparative example) on which the annealing is not performed. In the example shown in FIG. 3, HeatPulse 8108 manufactured by AG Associates, USA is used, and the annealing is performed by the rapid thermal annealing for 600 seconds in a nitrogen atmosphere at 400° C. wherein the rate of temperature increase is 60° C./second.

Turning to a peak of the second tantalum oxide material layer 106*b*F shown in FIG. 3, there is no deterioration of the oxygen concentration profile as that shown in FIG. 18. Thus, it is conceived that the deterioration of the oxygen concentration profile is not caused by the annealing step at least in the annealing conditions described above.

[Definition of Effective Film Thickness of Second Tantalum Oxide Layer]

In the analysis of the oxygen concentration profile by the Auger electron spectroscopy as shown in FIG. 3, however, detailed evaluation cannot be performed with respect to, for example, annealing conditions dependent for the effect of inhibiting the deterioration of the oxygen concentration profile. Thus, the inventors have considered a way to use an initial resistance value of the variable resistance element for the evaluation of the effects of inhibiting the deterioration of the oxygen concentration profile.

The resistivity of the second tantalum oxide material layer 106*b*F is sufficiently larger (for example, one or more order of magnitude) than the resistivity of the first tantalum oxide material layer 106*a*F. Thus, the initial resistance value of the variable resistance element 112 is determined based on the resistance value of the second tantalum oxide layer 106*b* that has substantially large resistivity.

Furthermore, the resistance value of the second tantalum oxide layer 106*b* is determined based on its size, film thickness, and oxygen content percentage. If the thermal treatment is performed in the process for manufacturing the variable resistance element 112, oxygen diffuses from the second tantalum oxide layer 106*b* to the first tantalum oxide layer 106*a*, ending up a decrease of the content percentage of oxygen included in the second tantalum oxide layer 106*b* (deterioration of the oxygen concentration profile). The decrease of the content percentage of oxygen included in the second tantalum oxide layer 106*b* decreases the initial resistance value of the variable resistance element 112. For this reason, it is conceived that the deterioration of the oxygen concentration profile can be known from the initial resistance value of the variable resistance element 112.

Figure 4:
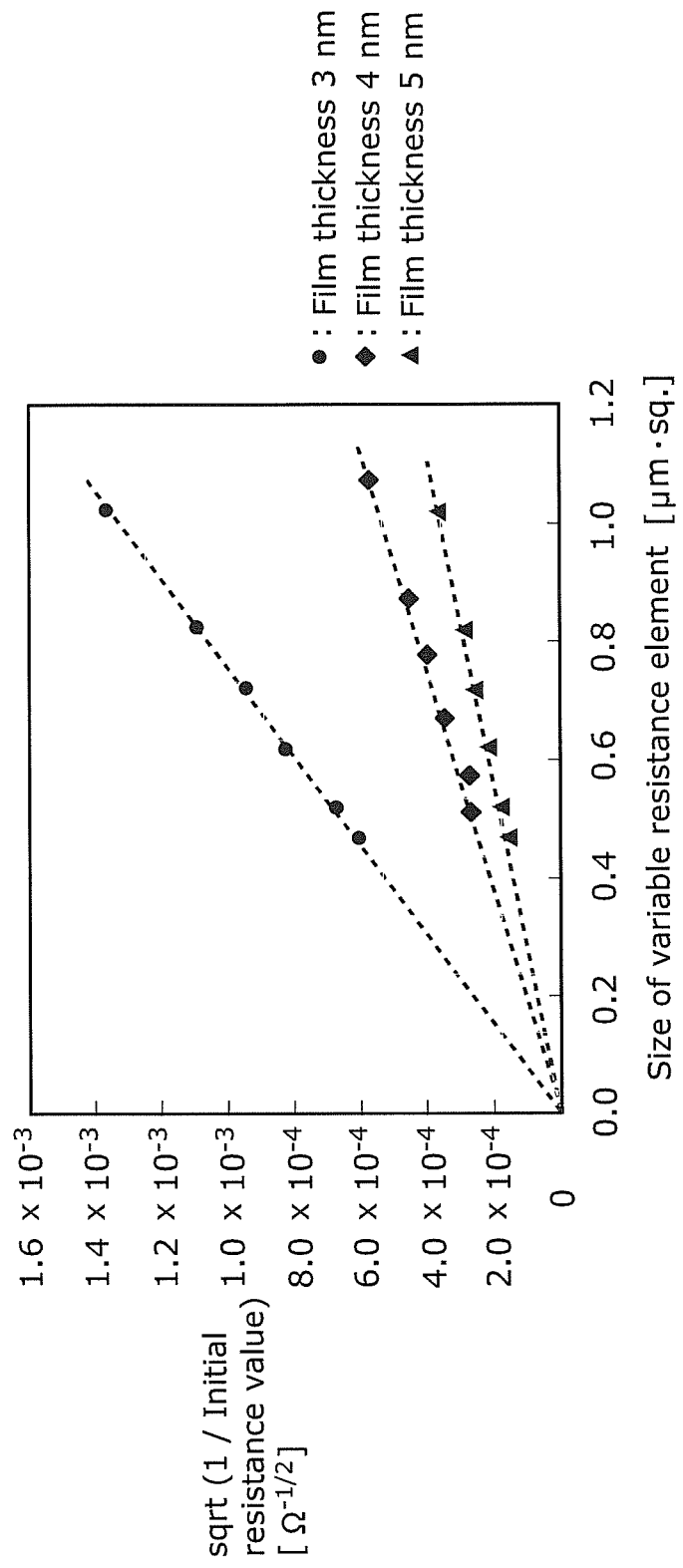
FIG. 4 is a diagram showing a relationship between the size and the square root of the inverse of an initial resistance value of a variable resistance element formed without thermal treatment.

FIG. 4 is a diagram showing a relationship between the size and the square root (hereinafter, represented by $(1/\rho)^{1/2}$) of the inverse of the initial resistance value of the variable resistance element 112 formed without the thermal treatment. In the example shown in FIG. 4, since the variable resistance element is not thermally treated, the deterioration of the oxygen concentration profile is not occurred. FIG. 4 shows the relationship between the size and $(1/\rho)^{1/2}$ of the variable resistance element 112 when the film thickness of the second tantalum oxide layer 106*b* is 3 nm (solid circles in FIG. 4), 4 nm (solid diamonds in FIG. 4), and 5 nm (solid triangles in FIG. 4). Here, the size of the variable resistance element 112 indicated on the horizontal axis in FIG. 4 refers to the length of one side of the variable resistance element 112 having a square shape in plan.

It can be seen from the result shown in FIG. 4 that $(1/\rho)^{1/2}$ is in a linear relationship with the size of the variable resistance element 112, and the slope is different depending on the film thickness of the second tantalum oxide layer 106*b*. Hereinafter, a slope obtained by linearly approximating the size and $(1/\rho)^{1/2}$ of the variable resistance element 112 will be represented by g.

Figure 5:
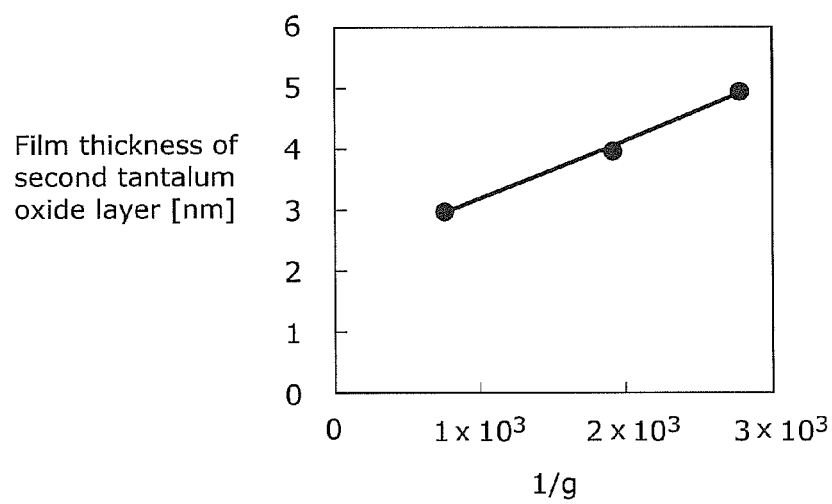
FIG. 5 is a diagram showing a relationship between the film thickness of the second tantalum oxide layer and an inverse of a slope of the square root of the inverse of the initial resistance value of the variable resistance element.

FIG. 5 shows a relationship between the film thickness of the second tantalum oxide layer 106*b* and the inverse (1/g) of the slope (g) of the square root of the inverse of the initial resistance value of the variable resistance element 112. It can be seen from FIG. 5 that the film thickness of the second tantalum oxide layer 106*b* is in a linear relationship with the inverse of g. Here, assuming that the film thickness of the second tantalum oxide layer 106*b* the oxygen concentration profile of which is deteriorated by the thermal treatment is also represented on the linear line shown in FIG. 5, an effective film thickness $d_a$ of the second tantalum oxide layer 106b can be defined by a mathematical equation for the linear line shown in FIG. 5, namely, the following mathematical formula (1):

$$d_a = 9.84 \times 10^{-4} \times (1/g) + 2.21 \quad (1)$$

Here, $d_a$ represents the effective film thickness of the second tantalum oxide layer 106b. In other words, the effective film thickness is a film thickness obtained by converting, based on an initial resistance value of the annealed second tantalum oxide layer 106b, the film thickness of the annealed second tantalum oxide layer 106b into the film thickness of the second tantalum oxide layer 106b of the variable resistance element 112 when no annealing is performed. A degree of the deterioration of the oxygen concentration profile can be evaluated based on the effective film thickness $d_a$, indicated in mathematical equation (1), of the second tantalum oxide layer 106b.

[Verification of Annealing Effect, Based on Effective Film Thickness of High Resistance Layer]

Due to the deterioration of the oxygen concentration profile due to the thermal treatment, the effective film thickness $d_a$ (effective film thickness of the high resistance layer) of the second tantalum oxide layer 106b, which is a high resistance layer, is smaller than the film thickness (actual film thickness) d of the second tantalum oxide material layer 106bF formed in the step illustrated in (f) of FIG. 2. This allows for evaluation of the degree of deterioration of the oxygen concentration profile, based on the difference between the film thickness d and the effective film thickness $d_a$. Hereinafter, when describing the difference between the film thickness and the effective film thickness as Δd, the difference Δd (hereinafter, referred to as "amount of film loss") between the film thickness and the effective film thickness will be represented by the following mathematical formula (2):

$$\Delta d = d - d_a \quad (2)$$

According to mathematical formula (2), it can be determined that the smaller the amount of film loss Δd is, the closer the effective film thickness $d_a$ is to the film thickness d, and accordingly, the smaller the degree of deterioration of the oxygen concentration profile is.

Figure 6:
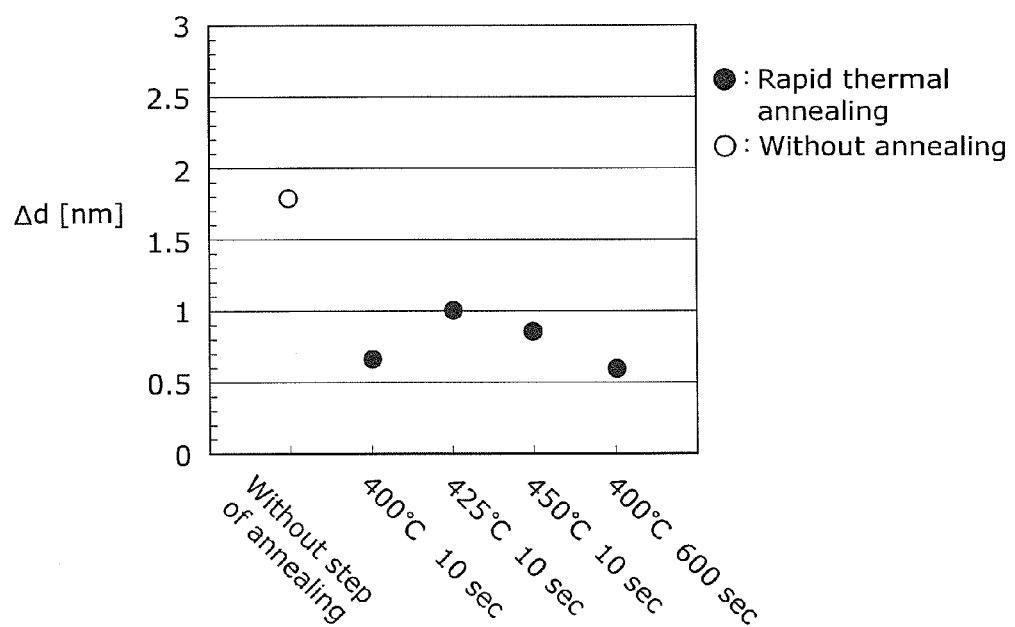
FIG. 6 is a diagram showing a relationship between annealing conditions and a difference between the film thickness and the effective film thickness of the second tantalum oxide layer when the annealing method is rapid thermal annealing.

FIG. 6 is a diagram showing a relationship between the annealing conditions and the amount of film loss Δd of the second tantalum oxide layer when the annealing method is the rapid thermal annealing. Particularly, FIG. 6 is a diagram showing a relationship between the annealing conditions and the amount of film loss Δd, with respect to examples which are the nonvolatile memory device 10 formed according to the steps shown in FIG. 1 and a comparative example which is a conventional nonvolatile memory device 20 formed without annealing. In FIG. 6, the open circle indicates the case (the comparative example) without the annealing step, and the solid circles indicate the amounts of film loss Δd in the case (the examples) where the rapid thermal annealing is performed. In the examples shown in FIG. 6, the film thickness of the second tantalum oxide material layer 106bF formed in the step illustrated in (f) of FIG. 2 is 6 nm in all the examples and the comparative example, and the annealing is the rapid thermal annealing performed in a nitrogen atmosphere where the rate of temperature increase is 60° C./second. Moreover, in the examples, the rapid thermal annealing is performed using different combinations of the temperature and duration of the annealing which are 400° C. and ten seconds, 425° C. and ten seconds, 450° C. and ten seconds, and 400° C. and 600 seconds. Moreover, both the samples are thermally treated for ten minutes at 400° C.

The result shown in FIG. 6 indicates that the amount of film loss Δd of the second tantalum oxide layer 206b is 1.8 nm in the comparative example in which the annealing step is not performed. On the other hand, in examples in which the rapid thermal annealing is performed, the amounts of film loss Δd are 1 nm or less in all the annealing conditions. From the result, it is confirmed that the rapid thermal annealing inhibits the deterioration of the oxygen concentration profile. Moreover, it can be observed from the result shown in FIG. 6 that the effects of inhibiting the deterioration of the oxygen concentration profile are obtained preferably when the annealing temperature is in a range between 400° C. and 450° C., both inclusive, and the annealing time is a range between ten seconds to 600 seconds, both inclusive.

Using a value of the amount of film loss Δd when the temperature of the annealing is 425° C. and the annealing time is ten seconds, and a value of the amount of film loss Δd when the temperature of the annealing is 450° C. and the annealing time is ten seconds, a relationship of the amount of film loss Δd to the temperature of the annealing is linearly extrapolated. Then, estimation is made on a lower limit value of the temperature of the annealing whereby the value of the amount of film loss Δd is less than 1.8 nm which is a value without the annealing step. According to the estimation, to reduce the amount of film loss Δd to less than 1.8 nm, the temperature of the annealing needs to be 560K or greater. In other words, it is conceived that the temperature required for the annealing is about 300° C. or higher.

The rate of temperature increase in the rapid thermal annealing is 60° C./sec or less. It takes five seconds for heating up to 300° C. in this rate of temperature increase. Thus, it is conceived that the annealing time needs to be five seconds or longer, including the heat-up time.

[Difference Between Rapid Thermal Annealing and Heater Heating Annealing]

Figure 7:
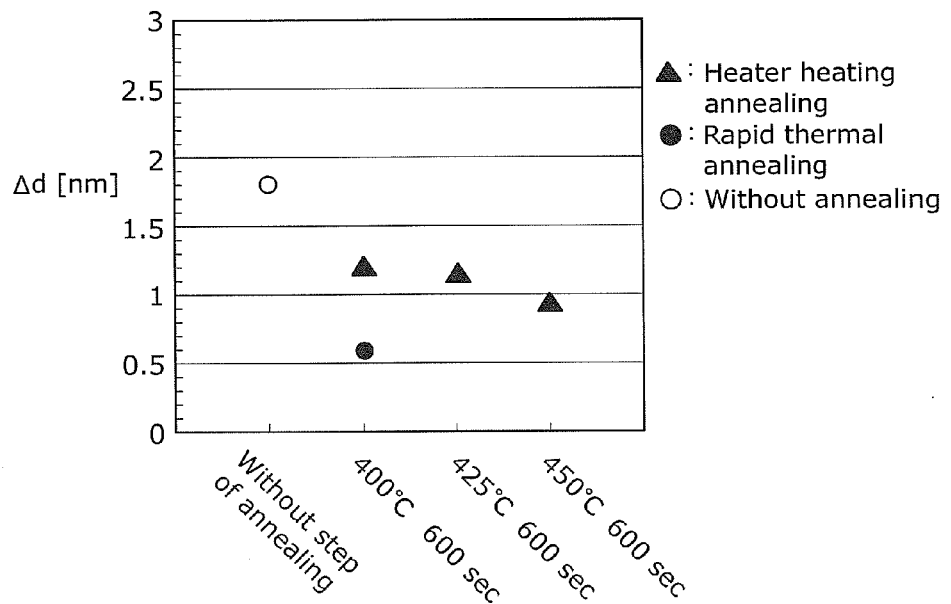
FIG. 7 is a diagram showing a relationship between annealing conditions and a difference between the film thickness and the effective film thickness of the second tantalum oxide layer when the annealing method is heater heating annealing.

FIG. 7 is a diagram showing a relationship between annealing conditions and the amount of film loss Δd of the second tantalum oxide layer 106b when the annealing method is the heater heating annealing. Particularly, FIG. 7 shows relationships between annealing conditions and values of the amount of film loss Δd of the second tantalum oxide layer 106b when the annealing method is the rapid thermal annealing and the heater heating annealing. In FIG. 7, the open circle indicates Δd when the annealing step is not performed, the solid circle indicates Δd when the rapid thermal annealing is performed, and the solid triangles indicate Δd when the annealing is performed using a heater. In the examples shown in FIG. 7 in which the heater heating annealing is performed, different annealing temperatures 400° C., 425° C., and 450° C. are set and the annealing time for each case is 600 seconds. Together, FIG. 7 shows the value of Δd of the nonvolatile memory device 20 obtained by the conventional manufacturing method in which the annealing is not performed.

As shown in FIG. 7, the examples in which the heater heating annealing is performed have larger values of the amount of film loss Δd of the second tantalum oxide layer 106b than the example in which the rapid thermal annealing is performed. In other words, it can be seen that the heater heating annealing has less effects of inhibiting the deterioration of the oxygen concentration profile than the rapid thermal annealing. The reason for this is considered to be a fact that the rate of temperature increase is slow in the heater heating annealing as compared to the rapid thermal annealing, and the heat-up time taken for a desired temperature to be reached is long, leading to the diffusion of oxygen in a heat-up time period from the second tantalum oxide layer 106b to the first tantalum oxide layer 106a, and the oxygen concentration profile is deteriorated during heating. Thus, in step (T) of annealing shown in FIG. 1, using the rapid thermal annealing allows for great effects of inhibiting the deterioration of the oxygen concentration profile. Additionally, even when the heater heating annealing is used, the value of the amount of film loss Δd is smaller than the comparative example in which the annealing step is not performed, and thus, the heater heating annealing also allows for the effects of inhibiting the deterioration of the oxygen concentration profile.

[Effects of Annealing in Reducing Atmosphere]

Figure 8:
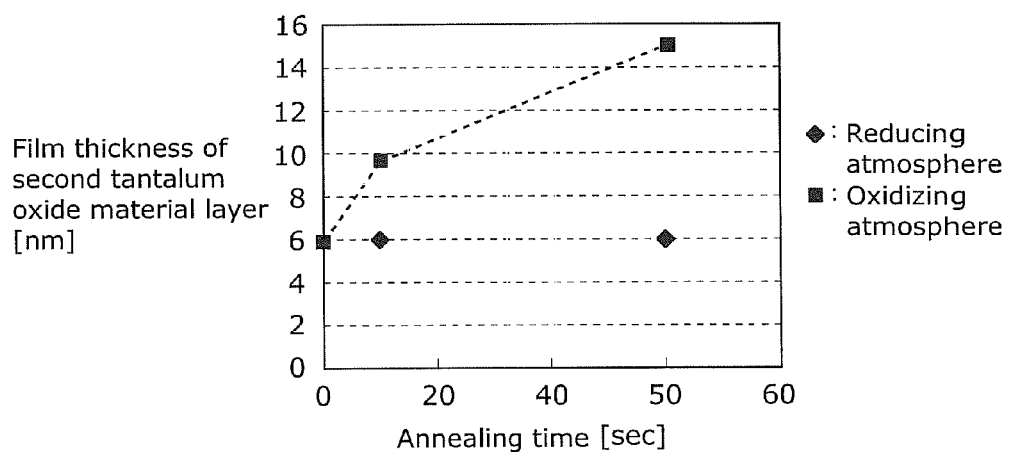
FIG. 8 is a diagram showing a relationship between the film thickness of the second tantalum oxide material layer and annealing time when an atmosphere during annealing is a reducing atmosphere or an oxygen atmosphere.

FIG. 8 is a diagram showing a relationship between the annealing time and the film thickness of the second tantalum oxide material layer 106bF when the atmosphere during the annealing step illustrated in (g) of FIG. 2 is a reducing (nitrogen) atmosphere and an oxidizing atmosphere. In FIG. 8, the solid diamonds indicate the film thicknesses of the second tantalum oxide layer 106b when the annealing is performed in the reducing atmosphere, and the solid squares indicate the film thicknesses of the second tantalum oxide layer 106b when the annealing is performed in the oxidizing atmosphere. It should be noted that the film thickness of the second tantalum oxide material layer 106bF is measured using the spectroscopic ellipsometry, when the annealing temperature is 400° C. The annealing time in the cases of the oxidizing atmosphere is zero seconds, ten seconds, and seconds, and the annealing time in the cases of the reducing atmosphere is ten seconds and 50 seconds. Here, the reducing atmosphere refers to a state in which no oxygen is supplied from outside to the first tantalum oxide material layer 106aF or the second tantalum oxide material layer 106bF.

It can be observed from the result shown in FIG. 8 that the annealing in the oxidizing atmosphere increases the film thickness of the second tantalum oxide material layer 106bF. This is because the annealing in the oxidizing atmosphere oxidizes the first tantalum oxide material layer 106aF and oxygen is further bonded to the tantalum oxide, resulting in an increased film thickness. Thus, it is desirable that the annealing according to the present embodiment is performed in an inert gas atmosphere comprising nitrogen gas or argon gas, or in a reducing atmosphere such as the reduced pressure atmosphere.

[Example Resistance Change Operation]

Next, an example operation of the nonvolatile memory device 10 according to the present embodiment 1 as a memory, namely, an example operation of the nonvolatile memory device 10 when writing/reading information will be described.

Figure 9:
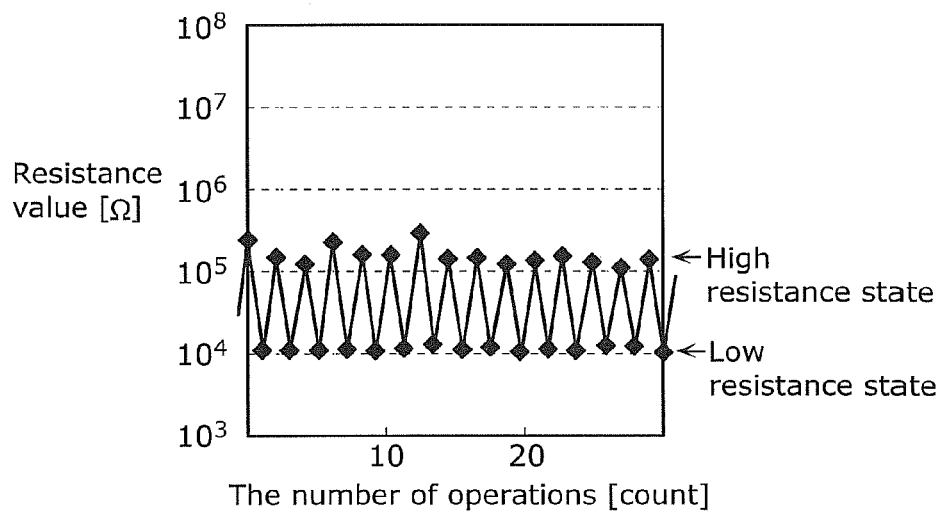
FIG. 9 is a diagram showing an example of a resistance change operation of the nonvolatile memory device.

FIG. 9 is a diagram showing an example of the resistance change operation of the nonvolatile memory device. Particularly, FIG. 9 shows resistance values in the high resistance state and the low resistance state of the nonvolatile memory device 10 when the resistance value is changed by application of voltage pulses having different polarities between the first electrode layer 105 and the second electrode layer 107 of the nonvolatile memory device 10.

Application of two types of voltage pulses having different polarities changes the resistance value of the nonvolatile memory device 10 as shown in FIG. 9. In the present example operation, when a negative voltage pulse (voltage: −1.8V, pulse width 100 ns) is applied between electrodes, the resistance state of the nonvolatile memory device 10 decreases from the high resistance state (resistance value: about $10^5 \Omega$) to the low resistance state (resistance value: about $10^4 \Omega$). On the other hand, when a positive voltage pulse (voltage 2.4, pulse width 100 ns) is applied between the electrodes, the resistance state of the nonvolatile memory device 10 increases from the low resistance state to the high resistance state. As shown in FIG. 9, when information is written by the variable resistance element 112 the resistance state of which being repeated between the high resistance state and the low resistance state, binary values which are the high resistance state and the low resistance state are stably detected as the change in the resistance value. Thus, it can be seen that the variable resistance element 112 according to the present embodiment repeats the stable resistance change operation without the resistance value of the high resistance state gradually decreasing. It should be noted that, herein, the case has been described where the resistance value changes between the binary values as an example resistance change operation. However, the present invention is not limited thereto. The resistance value may change among three or more levels.

[Verification of Endurance Characteristics]

Figure 10:
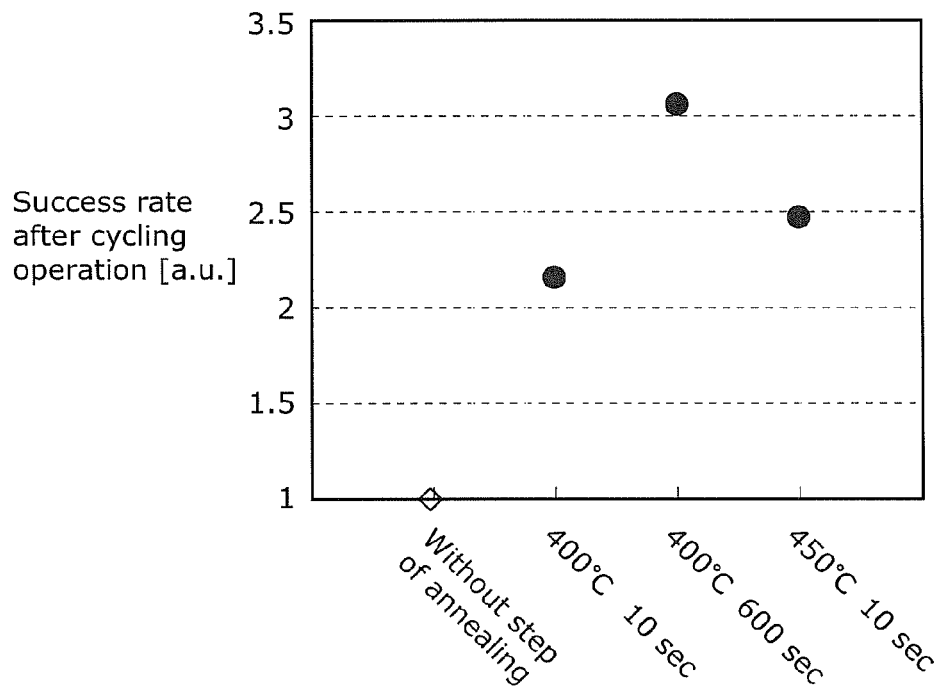
FIG. 10 is a diagram showing a relationship between the endurance characteristics of the nonvolatile memory device and annealing conditions.

Next, evaluation is carried out with respect to the endurance characteristics in which the resistance change operation shown in FIG. 9 is further repeated. FIG. 10 is a diagram showing a relationship between the endurance characteristics of the nonvolatile memory device 10 and annealing conditions. Particularly, FIG. 10 is a diagram showing a relationship between annealing conditions and a success rate after the cycling, of the nonvolatile memory device 10 formed by the manufacturing method illustrated in FIG. 2. Here, the open diamond in FIG. 10 indicates a case where the annealing step is not performed, and the solid circles indicate cases where the annealing is performed.

For the verification of the endurance characteristics, a ratio, which is obtained by causing 128 bits of a memory array to perform the cycling operation $10^5$ times to calculate the number of bits, out of 128 bits, that have successfully performed the cycling operation $10^5$ times, is described as success rate after the cycling operation. In a result of the verification of the endurance characteristics shown in FIG. 10, a ratio of the success rate after the cycling operation of the nonvolatile memory device 10 that is formed by the manufacturing method illustrated in FIG. 2 to the rate of the successful cycling operation of the nonvolatile memory device 20 that is formed by the conventional manufacturing method which doe not include the annealing step is shown based on the success rate after the cycling operation of the nonvolatile memory device 20 as 1. Moreover, the annealing shown in FIG. 10 is performed using different combinations of the annealing temperature and the annealing time which are 400° C. and ten seconds; 400° C. and 600 seconds; and 450° C. and ten seconds.

It can be observed from FIG. 10 that the annealing step in (g) of FIG. 2 increases the success rate after the cycling operation. The success rate of an annealed sample after the cycling operation is two or more times greater than the success rate after the cycling operation of the sample obtained without the annealing step.

It can be observed from the above result that the annealing step illustrated in (g) of FIG. 1 in the present embodiment inhibits the deterioration of the oxygen concentration profile and as a result, the endurance characteristics of the nonvolatile memory device 10 improves.

Embodiment 2

Method for Manufacturing Variable Resistance Element

Next, the embodiment 2 will be described. Hereinafter, the same reference signs will be given to the same components as in the embodiment 1, and components corresponding to those according to the embodiment 1 will not be described.

Figure 12:
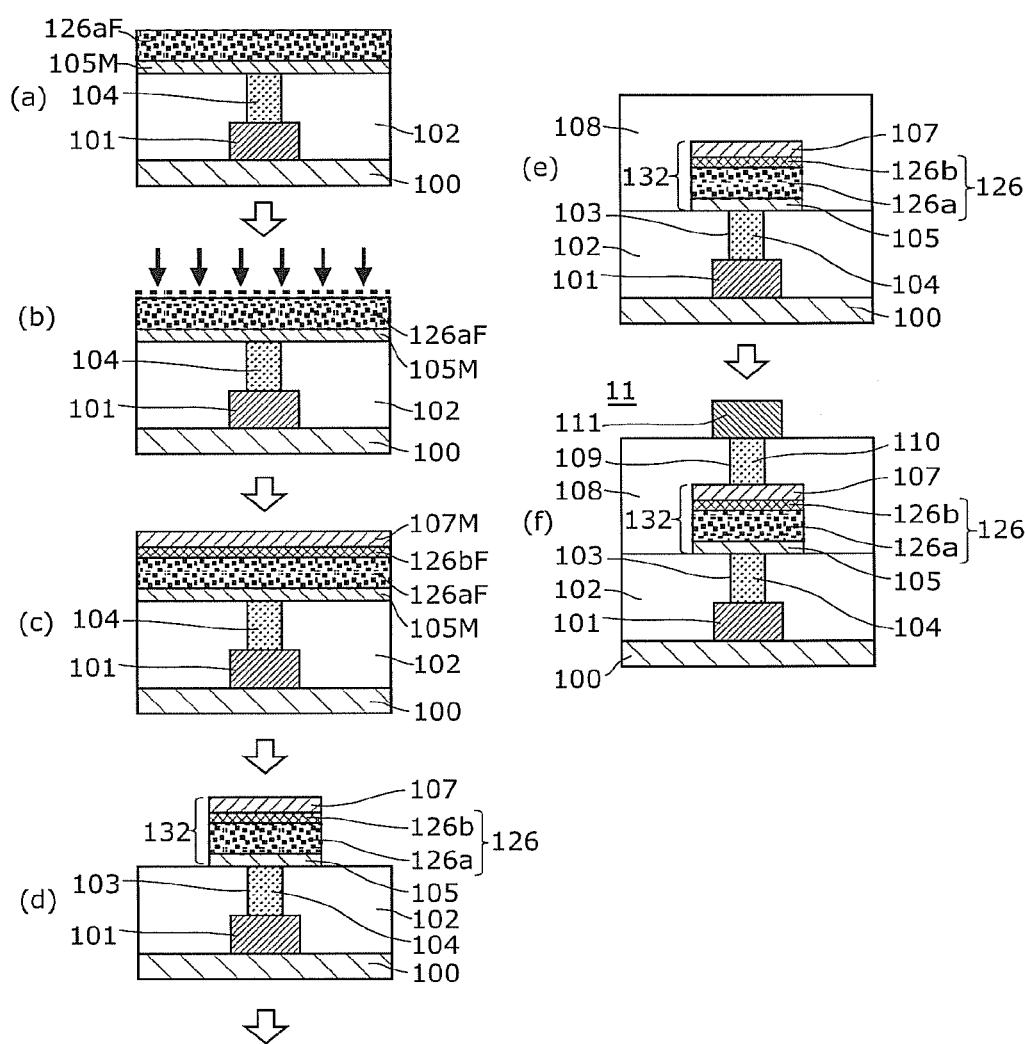
FIG. 12 shows cross-sectional views illustrating steps of a method for manufacturing important part of a nonvolatile memory device according to the embodiment 2, (a) is a cross-sectional view after steps of forming a first electrode material layer and a first tantalum oxide material layer, (b) is a cross-sectional view illustrating a step of annealing, (c) is a cross-sectional view after steps of forming a second tantalum oxide material layer and a second electrode material layer, (d) is a cross-sectional view after a step of forming a variable resistance element which includes a first electrode layer, a first tantalum oxide layer, a second tantalum oxide layer, and a second electrode layer, (e) is a cross-sectional view after a step of forming a second interlayer insulating layer, (f) is a cross-sectional view after steps of forming a second contact hole, a second contact plug, and a second line.

A nonvolatile memory device 11 according to the present embodiment (see (f) of FIG. 12) includes: above a substrate 100, a first line 101; a first interlayer insulating layer 102; a contact plug 104 formed within a contact hole 103; a first electrode layer 105; a variable resistance layer 126; a second electrode layer 107; a second interlayer insulating layer 108; a contact plug 110 formed within a contact hole 109; and a second line 111. A variable resistance layer 126 includes a first tantalum oxide layer 126a and a second tantalum oxide layer 126b. The first electrode layer 105, the variable resistance layer 126, and the second electrode layer 107 form a variable resistance element 132.

Figure 11:
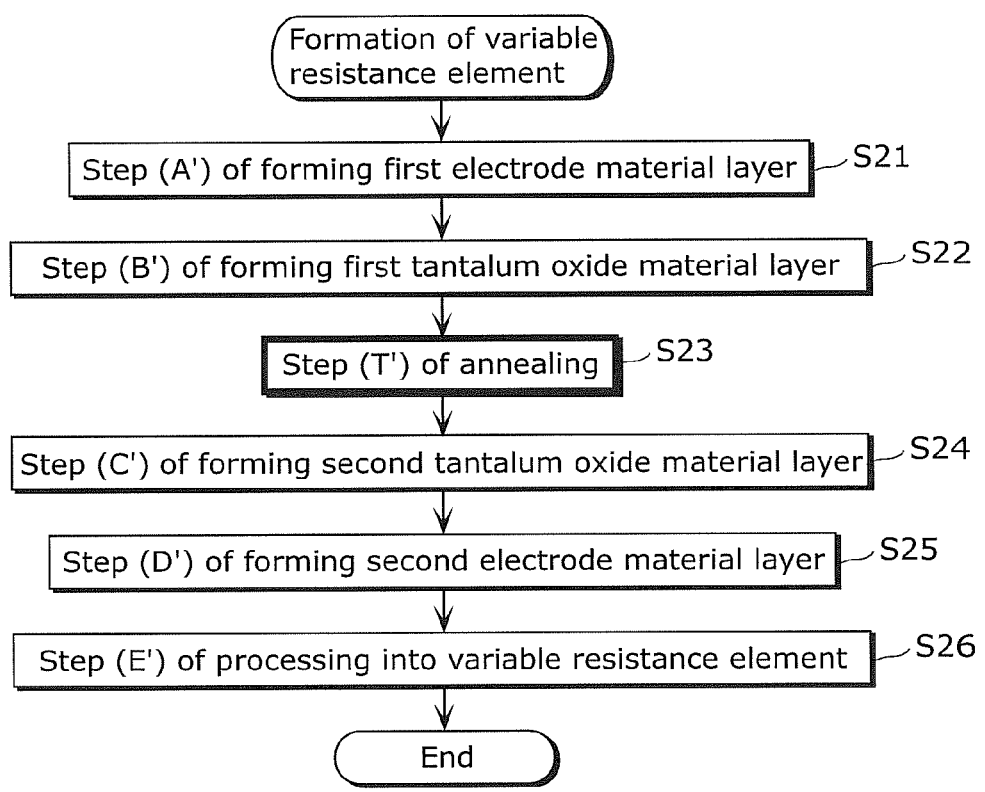
FIG. 11 is a process flow diagram illustrating steps of forming a variable resistance element according to an embodiment 2.

FIG. 11 is a process flow diagram illustrating steps of forming the variable resistance element 132 according to the embodiment 2. As shown in FIG. 11, a method for manufacturing the variable resistance element 132 according to the embodiment 2 includes the following: step (A') of forming a first electrode material layer 105M to be the first electrode layer 105; step (B') of forming a first tantalum oxide material layer 126aF to be the first tantalum oxide layer 126a; step (T') of annealing after the first tantalum oxide material layer 126aF is formed; step (C') of forming a second tantalum oxide material layer 126bF to be the second tantalum oxide layer 126b; step (D') of forming a second electrode material layer 107M to be the second electrode layer 107; and step (E') of processing the first electrode material layer 105M, the first tantalum oxide material layer 126aF, the second tantalum oxide material layer 126bF, and the second electrode material layer 107M, so as to have a desired pattern to form a variable resistance element 132 which includes the first electrode layer 105, the first tantalum oxide layer 126a, the second tantalum oxide layer 126b, and the second electrode layer 107.

The method for manufacturing the nonvolatile memory device 11 according to the embodiment 2 includes step (T') of annealing after the first tantalum oxide material layer 126aF is formed and before the second tantalum oxide material layer 126bF is formed, which is different from the embodiment 1. It should be noted that the present embodiment will be described as an example with reference to also the case where the oxygen content percentage of a second tantalum oxide material layer 106bF is higher than the oxygen content percentage of the first tantalum oxide material layer 106aF. It should be noted that the oxygen content percentages of the first tantalum oxide material layer 106aF and the second tantalum oxide material layer are not limited to the embodiment described below, and for example, a case where the oxygen content percentage of the first tantalum oxide material layer is higher than the oxygen content percentage of the second tantalum oxide material layer is included in the present embodiment.

[Method for Manufacturing Nonvolatile Memory Device]

Parts (a), (b), (c), (d), (e), and (f) of FIG. 12 are cross-sectional views illustrating steps of a method for manufacturing important part of the nonvolatile memory device 11 according to the embodiment 2. Part (a) of FIG. 12 is a cross-sectional view after the steps of forming the first electrode material layer 105M and the first tantalum oxide material layer 126aF, (b) of FIG. 12 is a cross-sectional view of a step of annealing, (c) of FIG. 12 is a cross-sectional view after steps of forming the second tantalum oxide material layer 126bF and the second electrode material layer 107M, (d) of FIG. 12 is a cross-sectional view after a step of forming the variable resistance element 132 which includes the first electrode layer 105, the first tantalum oxide layer 126a, the second tantalum oxide layer 126b, and the second electrode layer 107, (e) of FIG. 12 is a cross-sectional view after a step of forming the second interlayer insulating layer 108, (f) of FIG. 12 is a cross-sectional view after steps of forming the second contact hole 109, the second contact plug 110, and the second line 111. Hereinafter, the method for manufacturing the important part of the nonvolatile memory device 11 incorporating the variable resistance element 132 formed according to the process flow diagram shown in FIG. 11 will be described, with reference to (a) to (f) of FIG. 12. Components illustrated in FIG. 12 that are common to those illustrated in FIG. 2 will be indicated using the same reference signs. The steps up to the step of forming the first contact plug 104 are the same as those illustrated in FIG. 2, and the description will be omitted.

Part (a) of FIG. 12 is the cross-sectional view after the steps of forming the first electrode material layer 105M, the first tantalum oxide material layer 126aF, and the second tantalum oxide material layer 126bF. Following the formation of the first contact plug 104, in the present step, first, the first electrode material layer 105M (thickness: 20 nm or greater and 50 nm or less) comprising a tantalum nitride (TaN) is formed, by a sputtering method, over the first contact plug 104 and above the first interlayer insulating layer 102 (step S21 in FIG. 11).

Subsequently, the first tantalum oxide material layer 126aF is formed above the first electrode material layer 105M by a sputtering method (step S22). For the formation of the first tantalum oxide material layer 126aF, a method what is called the reactive sputtering method is used in which a sputtering target comprising tantalum is sputtered in an atmosphere containing oxygen. The thickness of the first tantalum oxide material layer 126aF is measured using the spectroscopic ellipsometry, and the thickness is 20 nm or greater and 30 nm or less by way of example. Sputtering conditions are, by way of example, that power supply output is 1000 W, pressure of deposition is 0.05 Pa, argon flow is 20 sccm, and oxygen gas flow is 21 sccm. It should be noted that the step illustrated in (a) of FIG. 12 corresponds to steps (A') and (B') according to the present embodiment.

Part (b) of FIG. 12 is the cross-sectional view illustrating a step of annealing the substrate 100 above which the first tantalum oxide material layer 126aF is formed. In the present embodiment, for example, the rapid thermal annealing is employed as the annealing method. In the step of annealing, preferably, the annealing is performed for ten seconds or longer and 600 seconds or shorter at a temperature in a range between 400° C. and 450° C., both inclusive, in a nitrogen atmosphere (step S23). It should be noted that the step illustrated in (b) of FIG. 12 corresponds to step (T') according to the present embodiment.

Part (c) of FIG. 12 is the cross-sectional view after the steps of forming the second tantalum oxide material layer 126bF and the second electrode material layer 107M. In the present step, first, the second tantalum oxide material layer 126bF is formed above the first tantalum oxide material layer 126aF (step S24). For the formation of the second tantalum oxide material layer 126bF, for example, a tantalum oxide having a composition represented by $Ta_2O_5$ is used as a sputtering target, and the RF magnetron sputtering method which uses argon (Ar) as the sputtering gas is employed. Sputtering conditions are, by way of example, that RF power supply output is 200 W, pressure of deposition is 0.3 Pa, argon gas flow is 300 sccm, and substrate temperature is a room temperature. A thickness, of the second tantalum oxide material layer 126bF stacked on the first tantalum oxide material layer 126aF, that is effective to cause the resistance change can be measured using the spectroscopic ellipsometry, and the thickness is 3 nm or greater and 10 nm or less by way of example.

Subsequently, iridium (Ir) as the second electrode material layer 107M is formed on the second tantalum oxide material layer 126bF by a sputtering method (step S25). It should be noted that step (c) of FIG. 12 corresponds to steps (C') and (D') according to the present embodiment.

Part (d) of FIG. 12 is the cross-sectional view after the step of forming the variable resistance element 132. In the present step, the first electrode material layer 105M, the first tantalum oxide material layer 126aF, the second tantalum oxide material layer 126bF, and the second electrode material layer 107M are processed by being patterned using a desired mask and dry etched, so as to have a desired pattern such as a pattern having a square shape in plan. This forms the variable resistance element 132 which includes the first electrode layer 105, the first tantalum oxide layer 126a, the second tantalum oxide layer 126b, and the second electrode layer 107 (step S26). It should be noted that the step illustrated in (d) of FIG. 12 corresponds to step (E') according to the present embodiment.

Part (e) of FIG. 12 is the cross-sectional view after the step of forming the second interlayer insulating layer 108. In the present step, the second interlayer insulating layer 108 (500 nm or greater and 1000 nm or less) is formed over the variable resistance element 132. After the formation of the second interlayer insulating layer 108, for purposes of relaxation of residual stress of the second interlayer insulating layer 108 and removal of residual water in the second interlayer insulating layer 108, the nonvolatile memory device 11 is, for example, thermally treated for ten minutes in a furnace heated at 400° C.

Part (f) of FIG. 12 is the cross-sectional view after the steps of forming the second contact hole 109 and the second contact plug 110. In the present step, the second contact hole 109 and the second contact plug 110 are formed in the same manufacturing method as illustrated in (a) to (e) of FIG. 2. Then, the second line 111 is formed over the second contact plug 110. After the formation of the second line 111, for the purposes of prevention of corrosion of aluminum included in the second line 111, the nonvolatile memory device 11 is, for example, thermally treated for ten minutes in a furnace heated at 400° C. for completion.

As described above, in the method for manufacturing the nonvolatile memory device 11 according to the present embodiment 2, the steps illustrated in (e) and (f) FIG. 12 each include a step of thermally treating the nonvolatile memory device 11 for ten minutes in a furnace heated at 400° C. The thermal treatment gives the variable resistance element 132 a thermal budget.

As shown in FIG. 11, the annealing in step (T') is performed before step (C') of forming the second tantalum oxide material layer 126bF. Performing the annealing before the second tantalum oxide material layer 126bF is formed has effects that the oxygen concentration profile of the variable resistance layer 126 hardly deteriorates even though the variable resistance element 132 is thermally treated which gives the variable resistance element 132 a thermal budget.

[Variation of Method for Manufacturing Variable Resistance Element]

Figure 13:
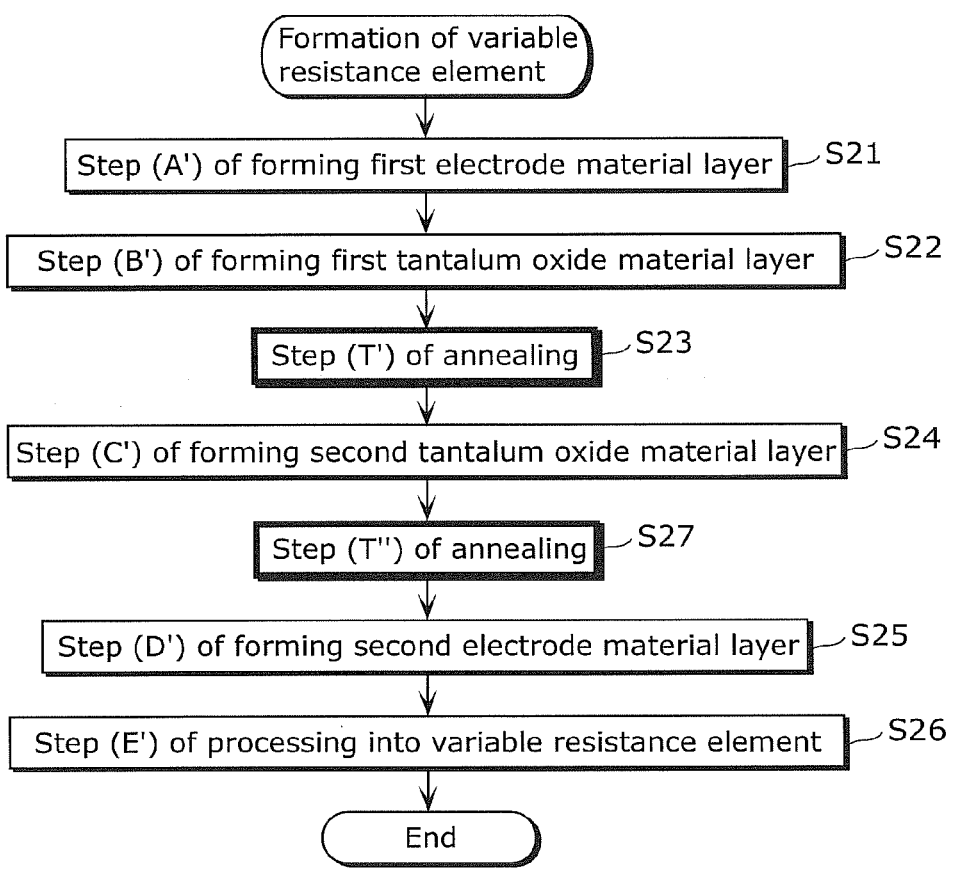
FIG. 13 is a process flow diagram illustrating steps of forming a variable resistance element according to a variation of the embodiment 2.

Here, a variation of the embodiment 2 will be described. FIG. 13 is a process flow diagram illustrating steps of forming a variable resistance element according to the variation of the embodiment 2. In the process flow diagram illustrating the steps of forming the variable resistance element according to the embodiment 2 shown in FIG. 11, the annealing step as illustrated in (g) of FIG. 2 in the embodiment 1 which is performed after the formation of the second tantalum oxide material layer 126bF is not provided. However, for purposes of further inhibiting the deterioration of the oxygen concentration profile to improve the endurance characteristics, the annealing may additionally be performed after the formation of the second tantalum oxide material layer 126bF. A process flow diagram of steps of manufacturing a variable resistance element 152 in which the annealing step is thus performed twice is shown in FIG. 13.

As shown in FIG. 13, the variation of the method for manufacturing the variable resistance element 152 according to the present embodiment 2 includes the following: step (A') of forming a first electrode material layer 105M to be a first electrode layer 105; step (B') of forming a first tantalum oxide material layer 146aF to be a first tantalum oxide layer 146a; step (T') of annealing after step (B'); step (C') of forming a second tantalum oxide material layer 146bF to be a second tantalum oxide layer 146b; step (T'') of additional annealing after step (C'); step (D') of forming a second electrode material layer 107M to be a second electrode layer 107; and step (E') of processing the first electrode material layer 105M, the first tantalum oxide material layer 146aF, the second tantalum oxide material layer 146bF, and the second electrode material layer 107M, so as to have a desired pattern to form a variable resistance element which includes the first electrode layer 105, the first tantalum oxide layer 146a, the second tantalum oxide layer 146b, and the second electrode layer 107.

Figure 14:
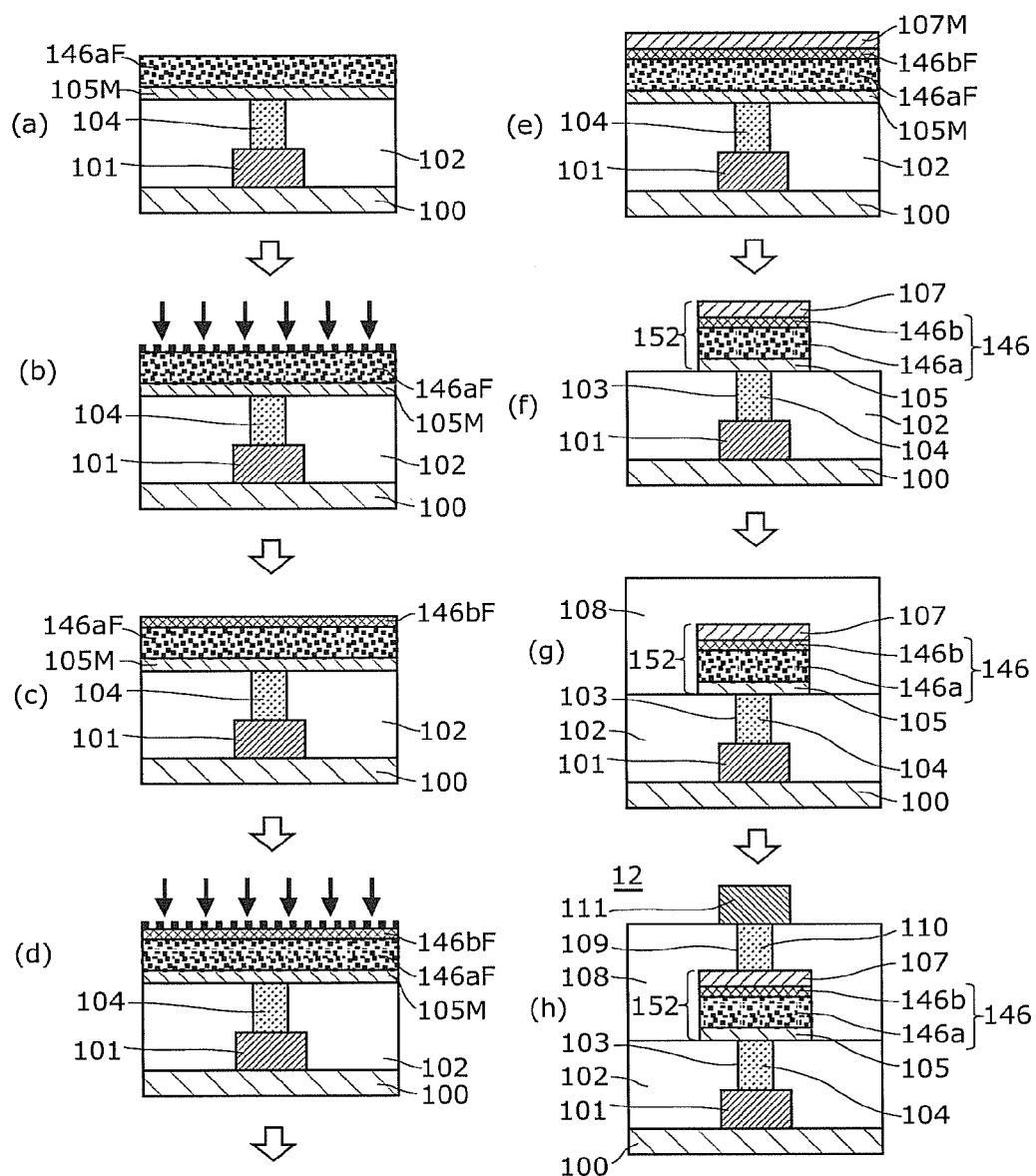
FIG. 14 shows cross-sectional views illustrating steps of a method for manufacturing important part of a nonvolatile memory device according to the variation of the embodiment 2, (a) is a cross-sectional view after steps of forming a first electrode material layer and a first tantalum oxide material layer, (b) is a cross-sectional view illustrating a step of annealing, (c) is a cross-sectional view after a step of forming a second tantalum oxide material layer, (d) is a cross-sectional view illustrating a step of annealing, (e) is a cross-sectional view after a step of forming a second electrode material layer, (f) is a cross-sectional view after a step of forming a variable resistance element which includes a first electrode layer, a first tantalum oxide layer, a second tantalum oxide layer, and a second electrode layer, (g) is a cross-sectional view after a step of forming a second interlayer insulating layer, (h) is a cross-sectional view after steps of forming a second contact hole, a second contact plug, and a second line.

Part (a), (b), (c), (d), (e), (f), (g), and (h) of FIG. 14 are cross-sectional views illustrating steps of a method for manufacturing important part of a nonvolatile memory device 12 according to the variation of the embodiment 2. Part (a) of FIG. 14 is a cross-sectional view after the steps of forming the first electrode material layer 105M and the first tantalum oxide material layer 146aF, (b) of FIG. 14 is a cross-sectional view illustrating the step of annealing, (c) of FIG. 14 is a cross-sectional view after the step of forming the second tantalum oxide material layer 146bF, (d) of FIG. 14 is a cross-sectional view illustrating the step of annealing, (e) of FIG. 14 is a cross-sectional view after the step of forming the second electrode material layer 107M, (f) of FIG. 14 is a cross-sectional view after the steps of forming the variable resistance element 152 which includes the first electrode layer 105, the first tantalum oxide layer 146a, the second tantalum oxide layer 146b, and the second electrode layer 107, (g) of FIG. 14 is a cross-sectional view after the step of forming the second interlayer insulating layer 108; and (h) of FIG. 14 is a cross-sectional view after the steps of forming the second contact hole 109, the second contact plug 110, and the second line 111.

The method for manufacturing the nonvolatile memory device 12 which is shown in FIG. 14 and formed according to the process flow diagram shown in FIG. 13 includes steps (a), (b), (g), and (h) illustrated in FIG. 14 are the same as steps (a), (b), (e), and (f), respectively, illustrated in FIG. 12, and thus the detailed description will be omitted.

Part (c) of FIG. 14 is the cross-sectional view after the step of forming the second tantalum oxide material layer 146bF. After the step of annealing illustrated in (b) of FIG. 14, in the present step, the second tantalum oxide material layer 146bF is formed on the first tantalum oxide material layer 146aF (step S24 in FIG. 13). For the formation of the second tantalum oxide material layer 146bF, for example, a tantalum oxide having a composition represented by $Ta_2O_5$ is used as a sputtering target, and the RF magnetron sputtering method which uses argon (Ar) as the sputtering gas is employed. Sputtering conditions are, by way of example, that RF power supply output is 200 W, pressure of deposition is 0.3 Pa, argon gas flow is 300 sccm, and substrate temperature is a room temperature. A thickness, of the tantalum oxide material layer 146bF stacked on the first tantalum oxide material layer 146aF, that is effective to cause the resistance change can be measured using the spectroscopic ellipsometry, and the thickness is 3 nm or greater and 10 nm or less by way of example.

An attempt is made to measure the resistivity of the second tantalum oxide material layer 146bF having a film thickness of 50 nm by the 4-terminal measurement method. The resistivity, however, exceeds a measurable upper limit ($10^8 \Omega$/sq.), and thus cannot be measured. Therefore, the resistivity of the second tantalum oxide material layer 106bF is at least $5 \times 10^5$ mΩcm or greater.

It should be noted that the step illustrated in (c) of FIG. 14 corresponds to step (C') according to the present embodiment.

Part (d) of FIG. 14 is the cross-sectional view illustrating the step of annealing. In the present step, the substrate 100 above which the first tantalum oxide material layer 146aF and the second tantalum oxide material layer 146bF are formed is annealed. In the present variation, the rapid thermal annealing is performed as the annealing method. In the step of anneal, the substrate 100 is annealed in a nitrogen atmosphere in a temperature range between 400° C. and 450° C., both inclusive, taking processing time of ten seconds or longer and 600 seconds or shorter (step S27). It should be noted that the step illustrated in (d) of FIG. 14 corresponds to step (T") according to the present embodiment.

Then, as illustrated in (e) to (h) of FIG. 14, step (D') of forming the second electrode material layer 107M and step (E') of forming the variable resistance element are performed to complete the nonvolatile memory device 12. It should be noted that the method for manufacturing the nonvolatile memory device 12 includes a step of thermal treatment for ten minutes in a furnace heated at 400° C. in the steps illustrated in (g) and (h) of FIG. 14. The thermal treatment gives the variable resistance element 132 a thermal budget.

As shown in FIG. 13, the annealing in step (T') is performed after step (B') of forming the first tantalum oxide material layer 146aF and before step (C') of forming the second tantalum oxide material layer 146bF, and after step (C') of forming the second tantalum oxide material layer 146bF and before step (D') of forming the second electrode material layer 107M. As such, performing the annealing each time after the first tantalum oxide material layer 146aF is formed and after the second tantalum oxide material layer 146bF is formed has effects that the oxygen concentration profile of a variable resistance layer 146 hardly deteriorates even though the variable resistance element 152 is thermally treated which gives the variable resistance element 152 a thermal budget.

[Verification of Annealing Effect, Based on Effective Film Thickness of High Resistance Layer]

Figure 15:
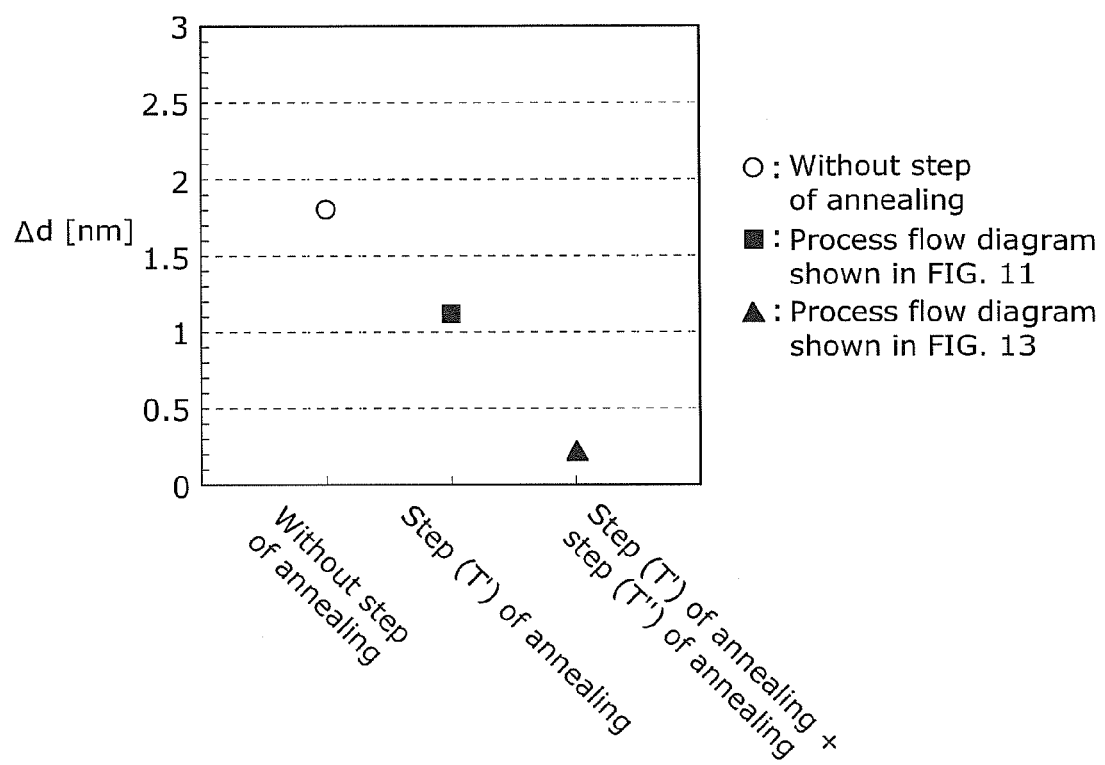
FIG. 15 is a diagram showing a difference between the film thickness and the effective film thickness of the second tantalum oxide layer of each of the nonvolatile memory devices according to the embodiment 2 and the variation of the embodiment 2.

FIG. 15 is a diagram showing annealing conditions of the nonvolatile memory devices according to the embodiment 2 and the variation of the embodiment 2, and a difference Δd (the amount of film loss) between the film thickness d and the effective film thickness $d_a$ of the second tantalum oxide layer (the film thickness of a high resistance layer). Particularly, FIG. 15 is a diagram showing values of the amounts of film loss Δd of the examples of the nonvolatile memory device 11 that is formed through the annealing in step (T') according to the process flow diagram shown in FIG. 11 and the nonvolatile memory device 12 that is formed through the annealing in steps (T') and (T") according to the process flow diagram shown in FIG. 13. In FIG. 15, the open circle indicates Δd without the annealing step, the solid square indicates Δd when the annealing is performed in step (T'), and the solid triangle indicates Δd when the annealing is performed in step (T') and step (T"). In all the examples shown in FIG. 15, the film thickness of the deposited second tantalum oxide material layer 126bF is 6 nm and the annealing is performed for 600 seconds in a nitrogen atmosphere at 400° C., using the rapid thermal annealing wherein the rate of temperature increase is 60° C./second. FIG. 15 together shows the amount of film loss Δd of the second tantalum oxide layer that is formed by the conventional method for manufacturing the nonvolatile memory device that does not include the annealing step.

It can be seen from a result shown in FIG. 15 that in the nonvolatile memory device 11 being annealed after the first tantalum oxide material layer 126aF is formed according to the process flow diagram shown in FIG. 11, the amount of film loss Δd is small as compared to the conventional nonvolatile memory device 20 obtained without the annealing step, and the deterioration of the oxygen concentration profile is inhibited.

Moreover, it can be seen that, in the nonvolatile memory device 12 annealed twice one of which is after the first tantalum oxide material layer 146aF is formed and the other of which is after the second tantalum oxide material layer 146bF is formed according to the process flow diagram shown in FIG. 13, the difference Δd between the film thickness and the effective film thickness is smaller and the deterioration of the oxygen concentration profile is inhibited to a greater extent, as compared to the case where the nonvolatile memory device 11 is obtained according to the process flow diagram shown in FIG. 11.

[Verification of Endurance Characteristics]

Figure 16:
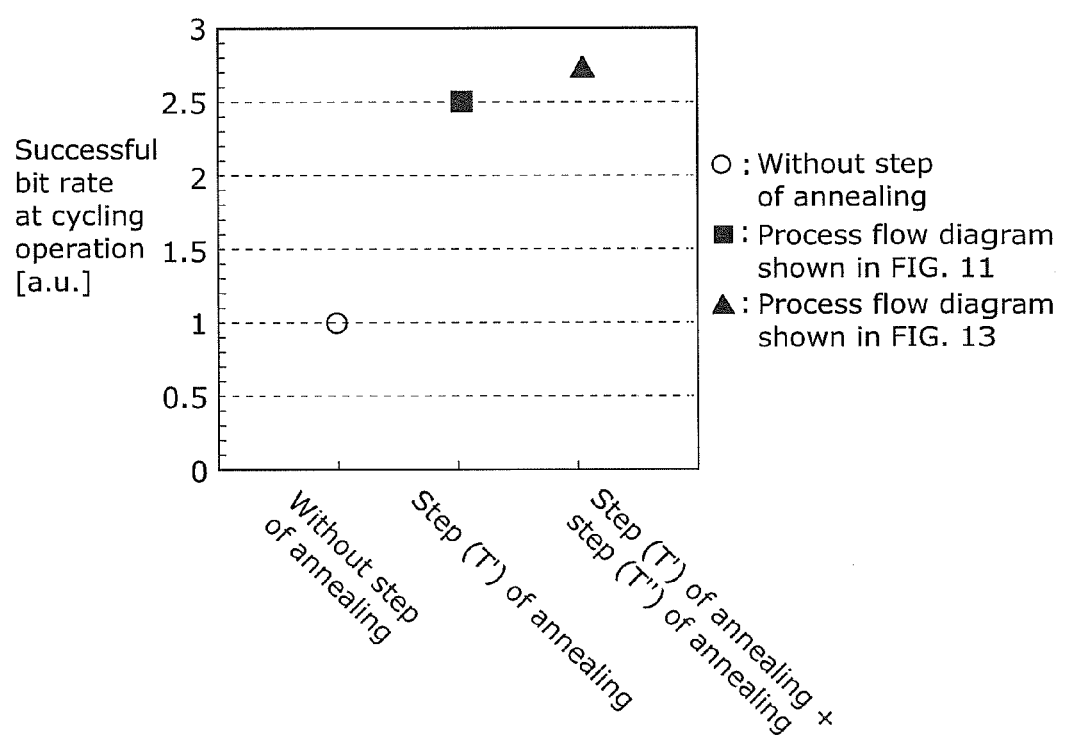
FIG. 16 is a diagram showing the endurance characteristics of the nonvolatile memory devices according to the embodiment 2 and the variation of the embodiment 2.
Figure 17:
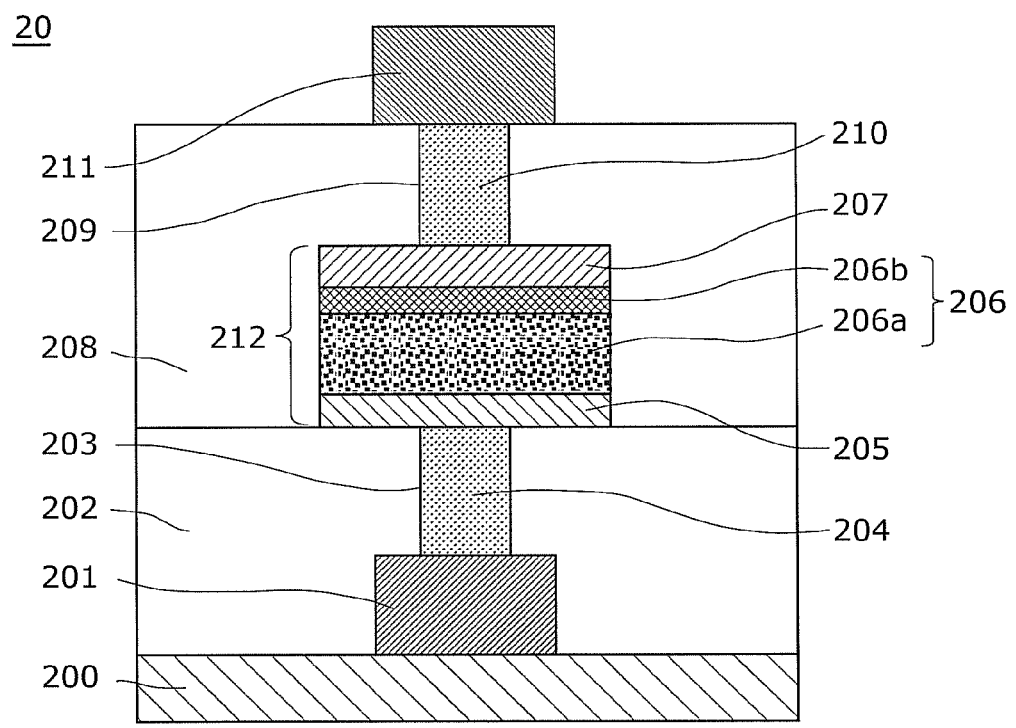
FIG. 17 is a cross-sectional view of a nonvolatile memory device incorporating a conventional variable resistance element.

FIG. 16 is a diagram showing the endurance characteristics of the nonvolatile memory devices according to the embodiment 2 and the variation of the embodiment 2. Particularly, FIG. 16 is a diagram showing the endurance characteristics of the nonvolatile memory device 11 formed according to process flow diagrams shown in FIG. 11 and FIG. 13. The endurance characteristics are validated by the same method as shown in the embodiment 1.

It can be seen from the result shown in FIG. 16 that because the annealing is performed after the first tantalum oxide material layer 126aF is formed according to the process flow diagram shown in FIG. 11, a rate of successful cycling operation increases and the endurance characteristics is improved, as compared to the nonvolatile memory device 20 obtained without the annealing step.

Moreover, it can be seen that, in the nonvolatile memory device 12 obtained by performing the annealing twice one of which is after the first tantalum oxide material layer 146aF is formed and the other of which is after the second tantalum oxide material layer 146bF is formed according to a process flow diagram shown in FIG. 13, the rate of successful cycling operation further increases and the endurance characteristics is further improved. Accordingly, it can be seen that the nonvolatile memory device 12 manufactured according to the process flow diagram shown in FIG. 13 enhances the improvement of the endurance characteristics.

While the method for manufacturing the nonvolatile memory device according to the present invention has been described, with reference to the embodiments, the present invention is not limited to the embodiments. Various modifications to the present embodiments that may be conceived by those skilled in the art are included in the scope of the present invention, without departing from the essence of the present invention. Moreover, the components of a plurality of the embodiments may arbitrary be combined without departing from the spirit of the present invention.

For example, in the above embodiments, the variable resistance element has been described in which tantalum is used as a metal included in the variable resistance layer, and which has the first tantalum oxide layer and the second tantalum oxide layer as a first metal oxide layer and a second metal oxide layer, respectively, of the variable resistance layer. However, the metals included in the first metal oxide layer and the second metal oxide layer may be a metal oxide other than tantalum.

Here, preferably, the metal oxide is a transition metal oxide. This is because transition metals can adopt multiple oxidization states, and thus different resistance states can be achieved by the redox reaction. Examples of the transition metal includes tantalum (Ta), titanium (Ti), hafnium (Hf), zirconium (Zr), niobium (Nb), and tungsten W).

For example, when a hafnium oxide is used, it has been found that the resistance value of the variable resistance layer is stably and rapidly changed, when x of a composition of the first hafnium oxide layer represented by $HfO_x$ is 0.9 or greater and 1.6 or less and a value of y of a composition of a second hafnium oxide layer represented by $HfO_y$ is greater than a value of x. In this case, preferably, the film thickness of the second hafnium oxide layer is 3 nm or greater and 4 nm or less.

When a zirconium oxide is used, it has been found that the resistance value of the variable resistance layer is stably and rapidly changed, when x of a composition of a first zirconium oxide layer represented by $ZrO_x$ is 0.9 or greater and 1.4 or less and a value of y of a composition of a second zirconium oxide layer represented by $ZrO_y$ is greater than a value of x. In this case, preferably, the film thickness of the second zirconium oxide layer is 1 nm or greater and 5 nm or less.

Moreover, the first transition metal included in the first metal oxide layer and the second transition metal included in the second metal oxide layer may be different transition metals. In this case, preferably, the second metal oxide layer has a smaller degree of shortage of oxygen, namely, a higher resistance value than the first metal oxide layer. Such a configuration allows the voltage applied between the first electrode layer and the second electrode layer for resistance change to be distributed greater to the second metal oxide layer than to the first metal oxide layer, corresponding to the resistance value of each layer. This causes the redox reaction in the second metal oxide layer to more likely to occur.

If the first transition metal and the second transition metal are different materials, preferably, the standard electrode potential of the second transition metal is smaller than the standard electrode potential of the first transition metal. The standard electrode potential represents a characteristic in which the greater the value of standard electrode potential is, the less the metal oxide is likely to oxidize, and the smaller the value is, the more the metal oxide is likely to oxidize. The second metal oxide layer comprising a metal oxide having a smaller the standard electrode potential than the first metal oxide layer causes the redox reaction more likely to occur in the second metal oxide layer.

Here, it is conceived that the redox reaction occurs in a micro filament (a conductive path) formed in the second metal oxide layer, which has a high resistance value, causes change in the resistance value, thereby causing the resistance change phenomenon to occur. Thus, disposing, in the second metal oxide layer, a metal oxide having a smaller standard electrode potential than the first metal oxide layer causes the resistance change in the second metal oxide layer tend to occur. Thus, a stable resistance change operation is obtained.

For example, an oxygen-deficient tantalum oxide may be used for the first metal oxide layer, and a titanium oxide ($TiO_2$) may be used for the second metal oxide layer. Titanium (standard electrode potential=−1.63 eV) is a material that has a lower standard electrode potential than tantalum (standard electrode potential=−0.6 eV), and thus according to the configuration, a stable resistance change operation is obtained.

As described above, even when a metal oxide other than tantalum is used as the metal to be included in the variable resistance layer, if at least the step of annealing the first metal oxide material layer is provided after the step of forming the first metal oxide material layer and before the step of forming the second electrode material layer, to inhibit the diffusion of oxygen atoms in the first metal oxide material layer and the second metal oxide material layer, the diffusion of oxygen from the second metal oxide material layer to the first metal oxide material layer is reduced. Thus, the effect that the oxygen concentration profile of the variable resistance layer hardly deteriorates is obtained. It should be noted that the step of annealing may be performed after the step of forming the second metal oxide material layer and before the step of forming the second electrode material layer, and alternatively, after the step of forming the first metal oxide material layer and before the step of forming the second metal oxide material layer.

Moreover, in the above embodiments, the annealing is performed by the annealing method: the rapid thermal annealing. However, the annealing may be performed by other processing method such as the heater heating annealing or a method of annealing by a furnace. Moreover, the annealing conditions such as the annealing temperature and the annealing time are not limited to the conditions shown in the above embodiments, and can be changed accordingly.

Moreover, in the above embodiments, the annealing is performed in the nitrogen atmosphere. However, the present invention is not limited thereto. For example, the annealing may be performed in an inert gas atmosphere comprising, for example, argon gas or in the reduced pressure atmosphere or the like.

Moreover, the materials of the first electrode layer and the second electrode layer described in the above embodiments are by way of example, and may be other materials. For example, the material of the second electrode layer connected to the second tantalum oxide material layer which has a high oxygen content percentage is not limited to Ir (iridium), and may be a material that has the standard electrode potential greater than the standard electrode potential of the transition metal included in the second tantalum oxide layer, such as Pt (platinum), Pd (palladium), Au (gold), Cu (copper), and Ag (silver). The material of the first electrode layer connected to the first tantalum oxide layer which has a low oxygen content percentage is not limited to TaN (tantalum nitride), and may be a material that has the standard electrode potential lower than the standard electrode potential of the second electrode layer, such as W (tungsten) and Ni (nickel).

Moreover, in the above embodiments, if one of the first tantalum oxide layer and the second tantalum oxide layer which are included in a stacked structure of the variable resistance element has a higher oxygen content percentage than the other, the order of stacking the first tantalum oxide material layer and the second tantalum oxide material layer may be opposite. In other words, above the first electrode layer, the second tantalum oxide layer and the first tantalum oxide layer may be formed in the stated order, and patterned and oxidized to form the variable resistance element. In this case, Pt, Ir, Pd, Au, Cu, Ag, or the like may be used for the first electrode layer connected to one of the first tantalum oxide material layer and the second tantalum oxide material layer that has a higher oxygen content percentage, and TaN, W, Ni, or the like may be used for the second electrode layer connected to the other of the first tantalum oxide layer and the second tantalum oxide material layer that has a lower oxygen content percentage.

Moreover, while the first electrode material layer, the first tantalum oxide material layer, the second tantalum oxide material layer, and the second electrode material layer are simultaneously patterned and dry etched to form the variable resistance element, the present invention is not limited thereto. For example, the first electrode material layer 105M, the first tantalum oxide material layer, the second tantalum oxide material layer, and the second electrode material layer 107M may be separately patterned and dry etched.

Moreover, the first electrode material layer, the first tantalum oxide material layer, the second tantalum oxide material layer, the second electrode material layer may not necessarily be patterned in the formation of the variable resistance element. The embodiments described above are applicable also to the case, for example, of forming a variable resistance element having a hole-filled structure in which portion or whole of each layer is filled in a hole provided in the interlayer insulating layer.

Moreover, the first tantalum oxide material layer and the second tantalum oxide material layer are not necessarily in contact, or the first electrode layer and the second electrode layer are not necessarily in contact with the first tantalum oxide material layer and the second tantalum oxide material layer, respectively, and other different layer, such as a third tantalum oxide material layer having a different oxygen content percentage, may be included between at least any of these layers.

Moreover, various modifications to the present embodiments that may be conceived by those skilled in the art and other embodiments constructed by combining constituent elements in different embodiments are included in the scope of the present invention, without departing from the essence of the present invention. For example, memory systems such as ReRAM which includes the nonvolatile memory device according to the present invention are included in the scope of the present invention.

A method for manufacturing a variable resistance element according to the present invention is effective as nonvolatile memory devices such as ReRAMs using the variable resistance element.

REFERENCE SIGNS LIST 10, 11, 12, 20 Nonvolatile memory device
100, 200 Substrate
101, 201 First line
102, 202 First interlayer insulating layer
103, 203 First contact hole
104, 204 First contact plug
105, 205 First electrode layer
105M First electrode material layer
106, 126, 146, 206 Variable resistance layer
106a, 126a, 146a, 206a First tantalum oxide layer
106aF, 126aF, 146aF, 206aF First tantalum oxide material layer
106b, 126b, 146b, 206b Second tantalum oxide layer
106bF, 126bF, 146bF, 206bF Second tantalum oxide material layer
107, 207 Second electrode layer
107M Second electrode material layer
108, 208 Second interlayer insulating layer
109, 209 Second contact hole
110, 210 Second contact plug
111, 211 Second line
112, 132, 152, 212 Variable resistance element

The invention claimed is:

1. A method for manufacturing a variable resistance element, the method comprising:
   forming a first electrode material layer above a substrate;
   forming a first tantalum oxide material layer on the first electrode material layer;
   forming a second tantalum oxide material layer on the first tantalum oxide material layer;
   forming a second electrode material layer on the second tantalum oxide material layer; and
   annealing at least the first tantalum oxide material layer to inhibit diffusion of oxygen atoms in the first tantalum oxide material layer and the second tantalum oxide material layer, after forming the first tantalum oxide material layer and before forming the second electrode material layer,
   wherein an oxygen content percentage of one of the first tantalum oxide material layer and the second tantalum oxide material layer is higher than an oxygen content percentage of the other, and
   in the annealing, annealing is performed at a temperature greater than or equal to 300° C. and less than or equal to 450° C. in a state in which no oxygen is supplied from outside.

2. The method for manufacturing the variable resistance element according to claim 1,
   wherein duration of the annealing is five seconds or longer and 600 seconds or shorter.

3. The method for manufacturing the variable resistance element according to claim 1,
   wherein the annealing is included after forming the second tantalum oxide material layer and before forming the second electrode material layer.

4. The method for manufacturing the variable resistance element according to claim 1,
   wherein the annealing is included after forming the first tantalum oxide material layer and before forming the second tantalum oxide material layer.

5. The method for manufacturing the variable resistance element according to claim 1,
   wherein the oxygen content percentage of the second tantalum oxide material layer is higher than the oxygen content percentage of the first tantalum oxide material layer.

6. The method for manufacturing the variable resistance element according to claim 1,
   wherein in the annealing, the annealing is performed by a rapid thermal annealing.

7. The method for manufacturing the variable resistance element according to claim 1,
   wherein in the annealing, the annealing is performed in an atmosphere comprising inert gas or a reduced pressure atmosphere.

8. The method for manufacturing the variable resistance element according to claim 7,
   wherein in the annealing, the inert gas is nitrogen gas or argon gas.

9. A method for manufacturing a variable resistance element, the method comprising:
   forming a first electrode material layer above a substrate;
   forming a first metal oxide material layer on the first electrode material layer;
   forming a second metal oxide material layer on the first metal oxide material layer;

forming a second electrode material layer on the second metal oxide material layer; and annealing at least the first metal oxide material layer to inhibit diffusion of oxygen atoms in the first metal oxide material layer and the second metal oxide material layer, after forming the first metal oxide material layer and before forming the second electrode material layer, wherein an oxygen content percentage of one of the first metal oxide material layer and the second metal oxide material layer is higher than an oxygen content percentage of the other, and in the annealing, annealing is performed at a temperature greater than or equal to 300° C. and less than or equal to 450° C. in a state in which no oxygen is supplied from outside.

10. The method for manufacturing the variable resistance element according to claim 9, wherein the annealing is included after forming the second metal oxide material layer and before forming the second electrode material layer.

11. The method for manufacturing the variable resistance element according to claim 9, wherein the annealing is included after forming the first metal oxide material layer and before forming the second metal oxide material layer.

* * * * *